US007260813B2

(12) United States Patent
Du et al.

(10) Patent No.: US 7,260,813 B2
(45) Date of Patent: Aug. 21, 2007

(54) METHOD AND APPARATUS FOR PHOTOMASK IMAGE REGISTRATION

(75) Inventors: Robert W. Du, Danville, CA (US); Ronald J. Lesnick, Jr., Hollister, CA (US); John T. Nogatch, Boulder Creek, CA (US)

(73) Assignee: Synopsys, Inc., Mountain View, CA (US)

( * ) Notice: Subject to any disclaimer, the term of this patent is extended or adjusted under 35 U.S.C. 154(b) by 411 days.

(21) Appl. No.: 10/973,890

(22) Filed: Oct. 25, 2004

(65) Prior Publication Data

US 2006/0088200 A1  Apr. 27, 2006

(51) Int. Cl.
*G06F 17/50* (2006.01)
(52) U.S. Cl. .............................. 716/21; 716/19; 716/4
(58) Field of Classification Search .................. 716/21, 716/19, 4
See application file for complete search history.

(56) References Cited

OTHER PUBLICATIONS

D.H. Ballad, Publication:"Generalizating the Hough Transform to Detect Arbitrary Shape", 1981, Pattern Recognition, vol. 13, No. 2,pp. 111-122.*
Philip M. Merlin et al. "Publication: A Parallel Mechanism for Detecting Curves in Pictures", Jan. 1975, III Transaction on Computers, pp. 96-98.*
Batchelor et al., Publication:"Machine Vision Applications, Architectures, and System Integration lll", Oct. 1994, Preceedings, SPIE—The International Society for OPtical Engineering, vol. 2347, pp. 1-9.*
Lisa Gottesfeld Brown, Publication:"A Survery of Image Registration Techniques", Dec. 1992, Department of Computer Science, Columbia University, ACM Computing Services, vol. 24, No. 4, pp. 325-376.*
Stephen S. Wilson, Publication:"Vector Morphology and Iconic Neural Networks", Dec. 1989, Transactions on Systems, Man and Cybernetics, vol. 19, No. 6, pp. 1636-1644.*

* cited by examiner

*Primary Examiner*—Sun James Lin
(74) *Attorney, Agent, or Firm*—Park, Vaughan & Fleming, LLP

(57) ABSTRACT

One embodiment of the present invention provides a system that computes translational differentials between a database-image and a scanned-image of a photomask. During operation, the system receives a noise-free database-image and a scanned-image that is generated by an imaging process. Next, the system determines whether the database-image has complex geometry and whether the database-image is a line-and-space pattern. If the database-image is a line-and-space pattern, the system first converts the scanned-image into a polarity-enhanced-image. The system then computes translational differentials by performing a correlation using the database-image and the polarity-enhanced-image. On the other hand, if the database-image is not a line-and-space pattern, the system computes translational differentials by performing a correlation using the database-image and the scanned-image. Note that the accuracy of the computed translational differentials is significantly increased because the system chooses a technique for computing the translational differentials which is suitable for the type of pattern present in the database-image.

39 Claims, 12 Drawing Sheets

METHOD AND APPARATUS FOR PHOTOMASK IMAGE REGISTRATION

BACKGROUND

1. Field of the Invention

This invention relates to the process of fabricating semiconductor chips. More specifically, the invention relates to a method and apparatus for computing the translational differentials between a database-image and a scanned-image of a photomask.

2. Related Art

The relentless miniaturization of integrated circuits has been a key driving force behind recent advances in computer technology. Today, integrated circuits are being built at deep sub-micron (DSM) dimensions. At these dimensions, photomask accuracy is becoming increasingly important in the chip manufacturing process.

A photomask is typically a high-purity quartz or glass plate that contains deposits of chrome metal, which represent the features of an integrated circuit. The photomask is used as a "master" by chipmakers to optically transfer these features onto semiconductor wafers.

The mask-making process involves complex physical, transport, and chemical interactions. As a result, the actual photomask is different from the "perfect" photomask. If this difference is too large, it can render the photomask useless. Hence, it is important to measure the features of the actual photomask, so that one can ensure that the imperfections are within the error tolerance.

Before the features on the actual photomask can be measured, the photomask needs to be scanned using an imaging process to generate a scanned image. Furthermore, the scanned image must be accurately aligned with the perfect image so that the features on the scanned image can be accurately measured. This alignment process is called "photomask image registration".

Typically, photomask image registration only involves determining the translational differentials (in 2D space) between the scanned image and the perfect image.

Unfortunately, the scanned image can contain noise. Furthermore, the scanned image and the perfect image can have different pixel depths. Moreover, the scanned image can contain a large number of pixels. For example, the scanned image can be a 512×512 grayscale image with an 8-bit pixel depth. For these reasons, it is very difficult to accurately and efficiently compute the translational differentials between the scanned image and the perfect image of a photomask.

Consequently, image registration is typically performed manually. Unfortunately, this manual step slows down the chip fabrication process, which increases the cost and the time taken to manufacture chips.

Hence, what is needed is a method and apparatus for accurately and efficiently computing the translational differentials between the scanned image and the perfect image of a photomask.

SUMMARY

One embodiment of the present invention provides a system that computes translational differentials between a database-image and a scanned-image of a photomask. During operation, the system receives a noise-free database-image and a scanned-image that is generated by an imaging process. Next, the system determines whether the database-image is a line-and-space pattern. If the database-image is a line-and-space pattern, the system first converts the scanned-image into a polarity-enhanced-image. The system then computes translational differentials by performing a correlation using the database-image and the polarity-enhanced-image. On the other hand, if the database-image is not a line-and-space pattern, the system computes translational differentials by performing a correlation using the database-image and the scanned-image. Specifically, the system determines whether the database-image has complex geometry. If the database-image is not a line-and-space pattern but has complex geometry, the system computes translational differentials using a correlation-filter based approach using the database-image and the scanned-image. On the other hand, if the database-image is not a line-and-space pattern and also does not have complex geometry, the system computes translational differentials using an orthogonal-projection based approach using the database-image and the scanned-image. Note that the accuracy of the computed translational differentials is significantly increased because the system chooses a technique for computing the translational differentials which is suitable for the type of pattern present in the database-image. Specifically, the correlation-filter based approach is suitable if the database-image is a line-and-space pattern or has complex geometry. Conversely, the orthogonal-projection based approach is suitable if the database-image is not a line-and-space pattern and has simple geometry.

In a variation on this embodiment, the system determines whether the database-image is a line-and-space pattern by first computing database-projection-vectors using the database-image by taking orthogonal projections along a set of directions. Next, the system determines whether only one of the database-projection-vectors contains a square-wave pattern, while the others contain a straight line. Note that, in an SEM image of a line-and-space pattern, it is typically very difficult to distinguish lines from spaces due to low image contrast. Consequently, directly applying image registration module usually does not produce satisfactory results, especially when the line and the space have similar widths. Hence, a polarity enhancement step is required to improve the image contrast.

In a variation on this embodiment, the system converts the scanned-image into a polarity-enhanced-image by first identifying a projection-direction for which the corresponding database-projection-vector contains a square-wave pattern. Note that the database-projection-vector is computed using the database-image by taking an orthogonal projection along the projection-direction. Next, the system computes a scanned-projection-vector using the scanned-image by taking an orthogonal projection along the projection-direction. Note that, taking an orthogonal projection along the projection-direction improves the signal-to-noise ratio for polarity identification by summing up pixels of the same type (e.g., line, space or edge). The system then identifies peaks in the scanned-projection-vector. Next, the system categorizes an inter-peak interval by comparing the values at the edges of the inter-peak interval with the average value over the inter-peak interval. Finally, the system changes the value of a pixel in the scanned-image based on the category of the corresponding inter-peak interval. Note that a pixel corresponds to an inter-peak interval if while taking an orthogonal projection along the projection-direction the pixel contributes to an element in the inter-peak interval.

In a variation on this embodiment, the system determines whether the database-image has complex geometry by first computing database-projection-vectors using the database-image by taking orthogonal projections along a set of directions. Next, the system differentiates the database projection vectors. The system then determines the number of edges by counting non-zero elements in the differentiated projection vectors. Specifically, if the total number of edges is greater than a threshold, the database-image has complex geometry. Conversely, if the number of edges is less than the threshold, the database-image has simple geometry. An exemplary complex geometry may contain many edges and non-Manhattan features. On the other hand, an exemplary simple geometry may contain Manhattan features with only a few edges.

In a variation on this embodiment, the system computes translational differentials using a correlation-filter based approach by first tiling the scanned-image and the database-image to obtain a tiled scanned-image and a tiled database-image, respectively. Note that the tiled scanned-image contains a set of sub-images, which are decimated versions of the scanned-image. Similarly, the tiled database-image contains a set of sub-images, which are decimated versions of the database-image. Moreover, note that, tiling the scanned-image improves the signal-to-noise ratio of the scanned image. Next, the system converts the tiled scanned-image and the tiled database-image into a windowed scanned-image and windowed database-image, respectively, by windowing each sub-image in the tiled scanned-image and tiled database-image. The system then applies a fast-Fourier-transform to the windowed scanned-image to obtain a transformed scanned-image. Next, the system applies a correlation-filter-template to the transformed image to obtain a filtered-image. The system then performs an inverse-fast-Fourier-transform using the filtered-image and the fast-Fourier-transform of the windowed database-image to obtain a correlation function. Next, the system identifies a peak in the correlation function. Finally, the system computes translational differentials based on the location of the identified peak.

In a variation on this embodiment, the system computes translational differentials using an orthogonal-projection based approach by first computing a set of candidate translational-differentials using the database-image and the scanned-image. The system then generates one or more sets of translated directional-gradient-images based on the set of candidate translational-differentials and using the database-image and the scanned-image. Next, the system converts the database-image into a set of smoothed directional-gradient-images. Finally, the system computes translational differentials by performing a normalized correlation using the set of smoothed directional-gradient-images and the one or more sets of translated directional-gradient-images. Note that the computational time is significantly reduced because the method performs normalized correlation using only the set of candidate-translational-differentials, instead of exhaustively performing normalized correlation using all possible translational differentials.

In a variation on this embodiment, the system converts the database-image and the scanned-image into a database-gradient-image and a scanned-gradient-image, respectively. Next, the system computes database-projection-vectors from the database-gradient-image and scanned-projection-vectors from the scanned-gradient-image by taking orthogonal projections along a set of directions. The system then extracts correlation-vectors from the database-projection-vectors. Next, the system maps the scanned-projection-vectors to an accumulator space to obtain accumulator-vectors by using the correlation-vectors. Finally, the system computes a set of candidate-translational-differentials based on the peak-cluster locations in the accumulator space, wherein a peak-cluster is a collection of contiguous elements around a peak (including the peak).

In a variation on this embodiment, the system creates a directional-gradient filter using the database-image, wherein the directional-gradient filter can be used to attenuate edgels that do not conform to the directional gradients of feature edges in the database-image. Next, the system converts the database-image and the scanned-image into a set of database directional-gradient-images and a set of scanned directional-gradient-images, respectively. The system then generates a raw database-gradient-image and a raw scanned-gradient-image from the set of database directional-gradient-images and the set of scanned directional-gradient-images, respectively. Finally, the system applies the directional-gradient filter to the raw database-gradient-image and the raw scanned-gradient-image to obtain the database-gradient-image and the scanned-gradient-image, respectively.

In a variation on this embodiment, the system de-projects only the cluster-peaks in the accumulator-vectors to obtain reconstructed scanned-projection-vectors. Next, the system de-projects the reconstructed scanned-projection-vectors to obtain reconstructed directional-gradient-images. Finally, the system generates one or more sets of translated directional-gradient-images by displacing the reconstructed directional-gradient-images using the set of candidate-translational-differentials. Note that by de-projecting only the cluster-peaks, the system improves the signal-to-noise ratio of the reconstructed directional-gradient-images.

In a variation on this embodiment, the system convolves the database-image with a horizontal and a vertical Point Spread Function (PSF) to generate a horizontal edgel-image and a vertical edgel-image, respectively. Next, the system computes a gradient-magnitude-image using the horizontal edgel-image and the vertical edgel-image. The system then applies a clip-low filter to the gradient-magnitude-image to obtain a clipped-gradient-image. Next, the system generates a histogram using the gradient orientations in the clipped-gradient-image. Finally, the system creates the directional-gradient filter using the histogram.

In a variation on this embodiment, the system converts the database-gradient-image into a set of unsmoothed directional-gradient-images. The system then applies a low-pass filter to the set of unsmoothed directional-gradient-images to obtain the set of smoothed directional-gradient-images.

DETAILED DESCRIPTION

Integrated Circuit Design and Fabrication

Figure 1:
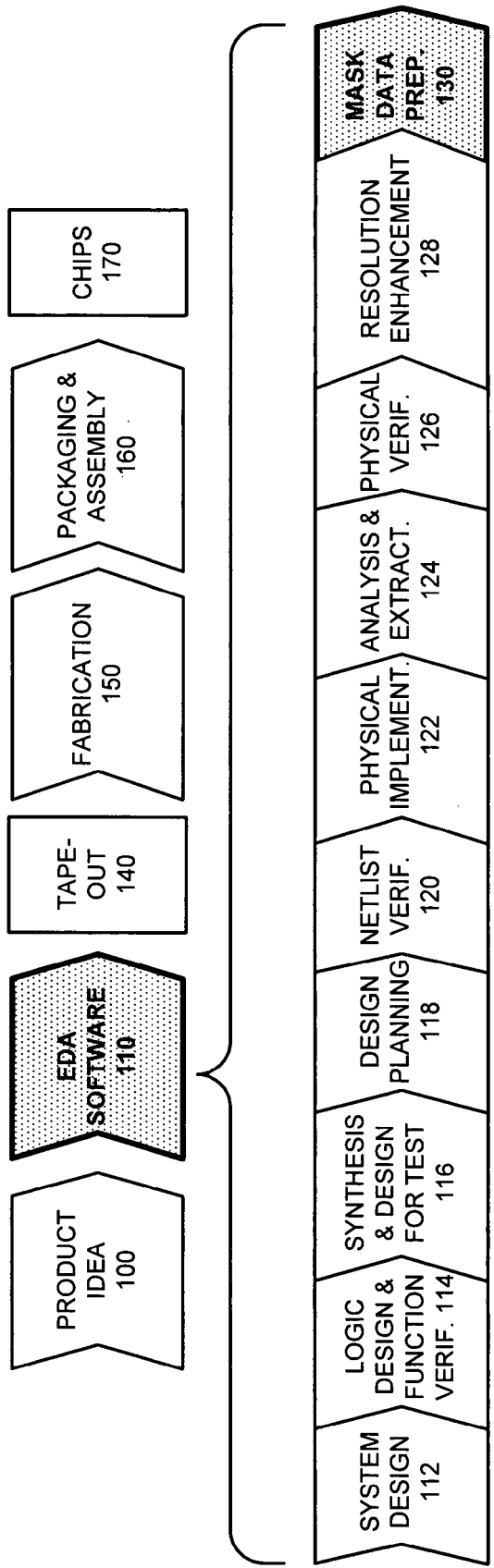
FIG. 1 illustrates the various steps in the design and fabrication of an integrated circuit in accordance with an embodiment of the present invention.

FIG. 1 illustrates the various steps in the design and fabrication of an integrated circuit in accordance with an embodiment of the present invention. The process starts with a product idea (step 100). Next, the product idea is realized by an integrated circuit, which is designed using Electronic Design Automation (EDA) software (step 110). Once the design is finalized in software, it is taped-out (step 140). After tape-out, the process goes through fabrication (step 150), packaging, and assembly (step 160). The process eventually culminates with the production of chips (step 170).

The EDA software design step 110, in turn, includes a number of sub-steps, namely, system design (step 112), logic design and function verification (step 114), synthesis and design for test (step 116), design planning (step 118), netlist verification (step 120), physical implementation (step 122), analysis and extraction (step 124), physical verification (step 126), resolution enhancement (step 128), and mask data preparation (step 130).

Photomask image registration can take place within the mask data preparation step 130, which involves generating the "tape-out" data for production of masks that are used to produce finished chips. Note that the CATS™ family of products from Synopsys, Inc. can be used in the mask data preparation step 130.

Photomask Image Registration

Figure 2:
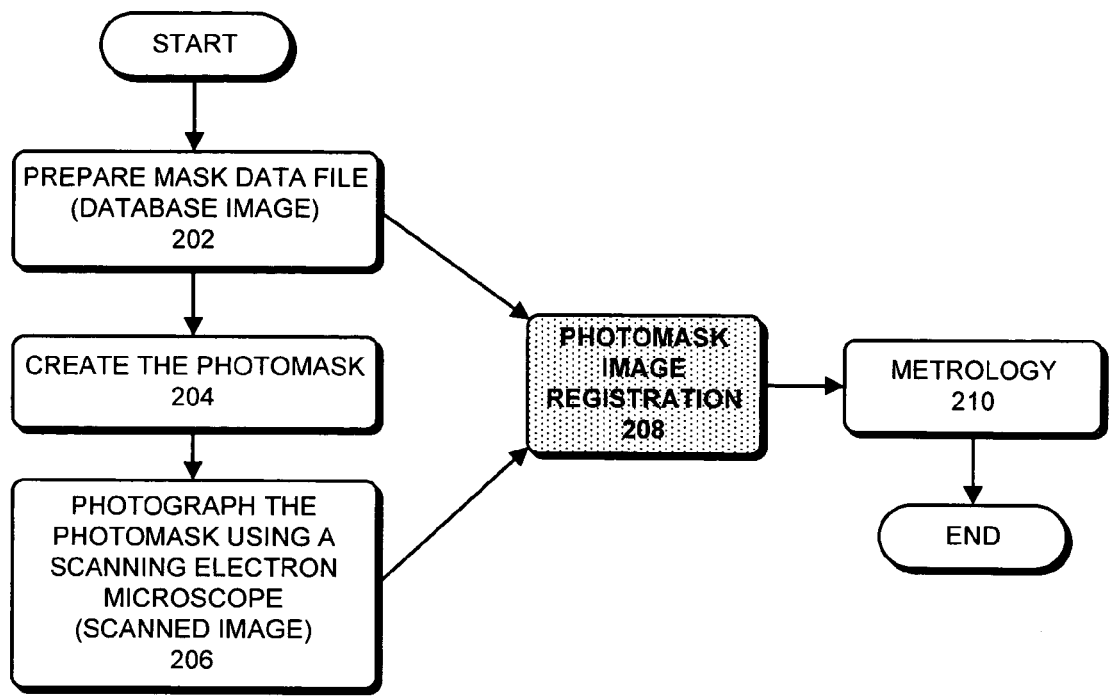
FIG. 2 presents a flowchart that illustrates a high level view of the photomask image registration process that precedes metrology in accordance with an embodiment of the present invention.

FIG. 2 illustrates a high level view of the photomask image registration process that precedes metrology in accordance with an embodiment of the present invention.

Once the logical design of an integrated circuit is finalized, the EDA software prepares a photomask data file (step 202), which describes the features on the photomask. Note that the photomask data file stores a digital representation of the "perfect" photomask image. In the instant application, the term "database image" refers to this "perfect" photomask image.

Next, a mask-making machine creates the photomask (step 204) using the photomask data file. Specifically, when the circuit design is "taped out," it is translated into GDSII format that is then given to the mask data preparation software. The mask data preparation software converts or "fractures" the GDSII design data into a format that describes the pattern to the mask-making machine.

A photomask is typically a high-purity quartz or glass plate that contains deposits of chrome metal, which represents the features of an integrated circuit. The photomask is used as a "master" by chipmakers to optically transfer these features onto semiconductor wafers.

Specifically, the mask-making machine uses a laser or an electron-beam to write the features of the integrated circuit onto a layer of photosensitive resist that has been added over a chrome layer on top of a blank mask. After exposure, the resist is developed, which is cleared away and uncovers the underlying chrome only where the circuit pattern is desired. The bared chrome is then etched. After etching, the remaining resist is completely stripped away, leaving the circuit image as transparent patterns in the otherwise opaque chrome film.

Note that the mask-making process involves complex physical, transport, and chemical interactions. As a result, the actual photomask image is different from the database image. If this difference is too large, it can render the photomask useless. Hence, it is critically important to measure the features of the actual photomask image, so that we can ensure that the difference is within the error tolerance. This measurement process is called metrology (step 210).

Before metrology (step 210) can take place, the photomask needs to be scanned (or photographed) using an imaging device, such as a scanning electron microscope (step 206). Henceforth, in the instant application, the term "scanned image" refers to a picture of the photomask that is taken using the imaging device. Furthermore, note that the scanned image (from step 206) must be aligned with the database image (from step 202) so that previously identified critical features in the database image can be located in the scanned image and then precisely measured. This alignment process is called "photomask image registration" (step 208).

In general, image registration involves spatially aligning two similar images. Specifically, in the absence of non-linearity, an image registration process results in a transformation matrix, which when applied to one of the images, aligns it with the other image. Note that, in general, image registration involves resizing, rotating, and translating an image. But, typically, photomask image registration only involves determining the translational differentials (in 2D space) between the database image and the scanned image.

Photomask Image Registration System

Figure 3:
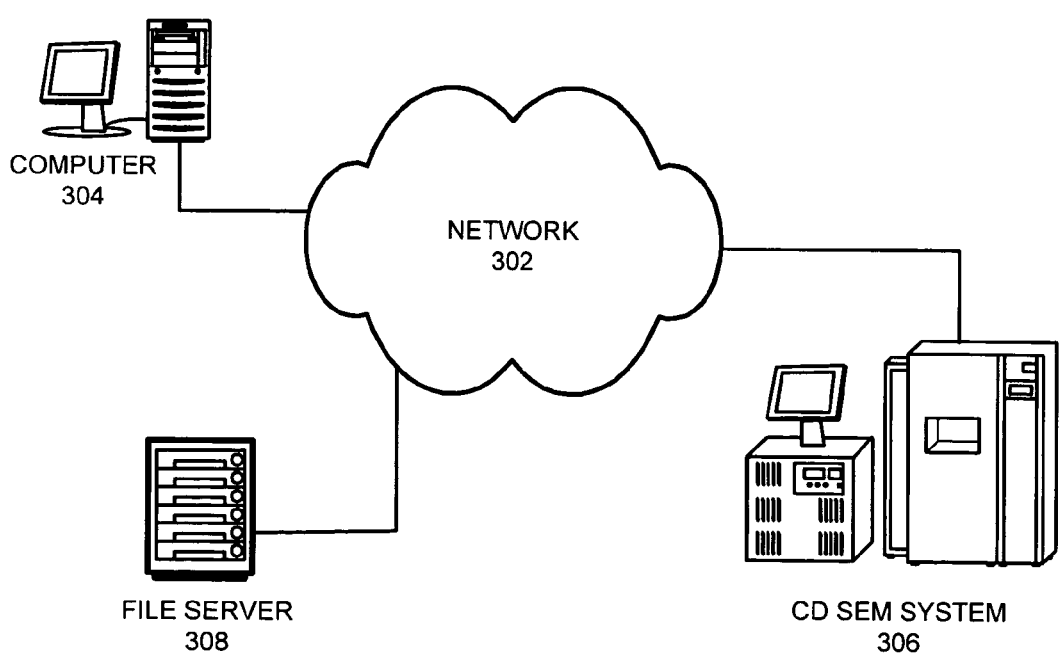
FIG. 3 illustrates a photomask image registration system that comprises a network which is coupled with a computer, a critical-dimension scanning-electron-microscope (CD SEM) system, and a file server in accordance with an embodiment of the present invention.

FIG. 3 illustrates a photomask image registration system that comprises a network 302 which is coupled with a computer 304, a critical-dimension scanning-electron-microscope (CD SEM) system 306, and a file server 308 in accordance with an embodiment of the present invention.

Note that the network 302 can generally include any type of wire or wireless communication channel capable of coupling together network nodes. This includes, but is not limited to, a local area network, a wide area network, or a combination of networks. In one embodiment of the present invention, network 302 includes the Internet.

Furthermore, in one embodiment of the present invention, the computer 304 stores and executes the image registration software. Moreover, in one embodiment of the present invention, the image registration software is included in the EDA software. Note that computer 304 can generally include any type of device that can perform computations. This includes, but is not limited to, a computer system based on a microprocessor, a personal computer, a mainframe computer, a server, and a workstation.

It will be apparent to one skilled in the art that the image registration software can be stored and executed in a number of ways. For example, in one embodiment of the present invention, the image registration software is executed on the CD SEM system 306.

In one embodiment of the present invention, the CD SEM system 306 can be used for taking detailed pictures of a photomask. Specifically, the resolution of the CD SEM system 306 can be less than the minimum feature size of the photomask. For example, in one embodiment of the present invention, the resolution of the CD SEM system 306 is a few nanometer, while the minimum feature size of the photomask is a few tenths of a micron.

Moreover, the CD SEM system 306 can be positioned with a high degree of precision. For example, in one embodiment of the present invention, the CD SEM system 306 can be positioned within a few nanometers of a target location.

It will be apparent to one skilled in the art that the present invention is not dependent on the type of imaging process that is used for taking pictures of the photomask. Accordingly, in the instant application, the CD SEM system 306 should be taken to represent any type of device that can take high resolution pictures.

In one embodiment of the present invention, the computer 304 can directly communicate with the CD SEM system 306 via the network 302. Specifically, in one embodiment of the present invention, the computer 304 and the CD SEM system 306 communicate with each other using files that are stored on the file server 308. Note that both the computer 304 and the CD SEM system 306 can communicate with the file server 308 via the network.

Process of Photomask Image Registration

Figure 7:
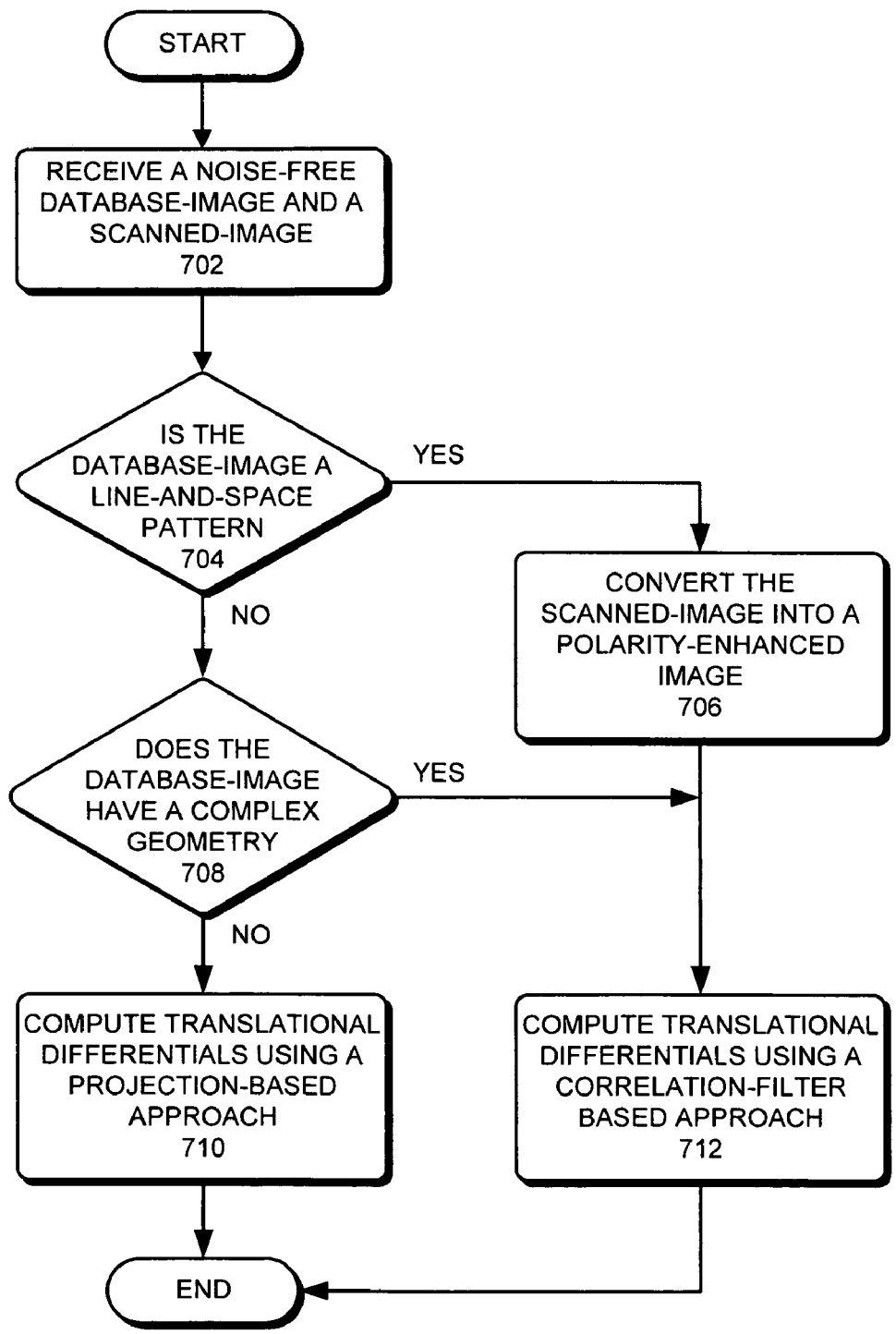
FIG. 7 presents a flowchart that illustrates the process of photomask image registration in accordance with an embodiment of the present invention.

FIG. 7 presents a flowchart that illustrates the process of photomask image registration in accordance with an embodiment of the present invention.

The process begins with receiving a noise-free database-image and a scanned image that is generated by an imaging process (step 702). Specifically, in one embodiment of the present invention, the database image is a noise-free 512× 512 binary image with 1-bit pixel depth, and the scanned image is a 512×512 grayscale image with an 8-bit pixel depth. Note that the pixel depth of the two images is different. Furthermore, the scanned-image can have noise. Specifically, the scanned-image can have significant amplitude distortions. Moreover the scanned-image can have edge distortions.

Next, the system determines whether the database-image is a line-and-space pattern (step 704). In one embodiment of the present invention, the system determines whether the database-image is a line-and-space pattern by first computing database-projection-vectors using the database-image by taking orthogonal projections along a set of directions. Next, the system finds out whether the database-image is a line-and-space pattern by determining whether only one of the database-projection-vectors contains a square-wave pattern, while the others contain a straight line.

If the database-image is a line-and-space pattern, the system then converts the scanned-image into a polarity-enhanced-image (step 706).

The system then checks whether the database-image has complex geometry (step 708). In one embodiment of the present invention, the system determines whether the database has complex geometry by first computing database-projection-vectors using the database-image by taking orthogonal projections along a set of directions. Next, the system differentiates the database projection vectors. The system then finds out whether the database-image has complex geometry by counting the number of non-zero elements in the differentiated database projection vectors. Note that the non-zero elements correspond to edges in the database-image. Furthermore, note that calculating differentiated database-projection-vectors and counting non-zero elements can be accomplished quickly because the database image is composed of 1-bit noise-free pixels.

In one embodiment of the present invention, a database-image has complex geometry if the total number of non-zero elements in the database projection vectors is greater than equal to a threshold. Conversely, if the total number of non-zero elements in the database projection vectors is less than the threshold, the database-image has simple geometry. Specifically, in one embodiment of the present invention, the threshold is equal to 7.

Figure 4:
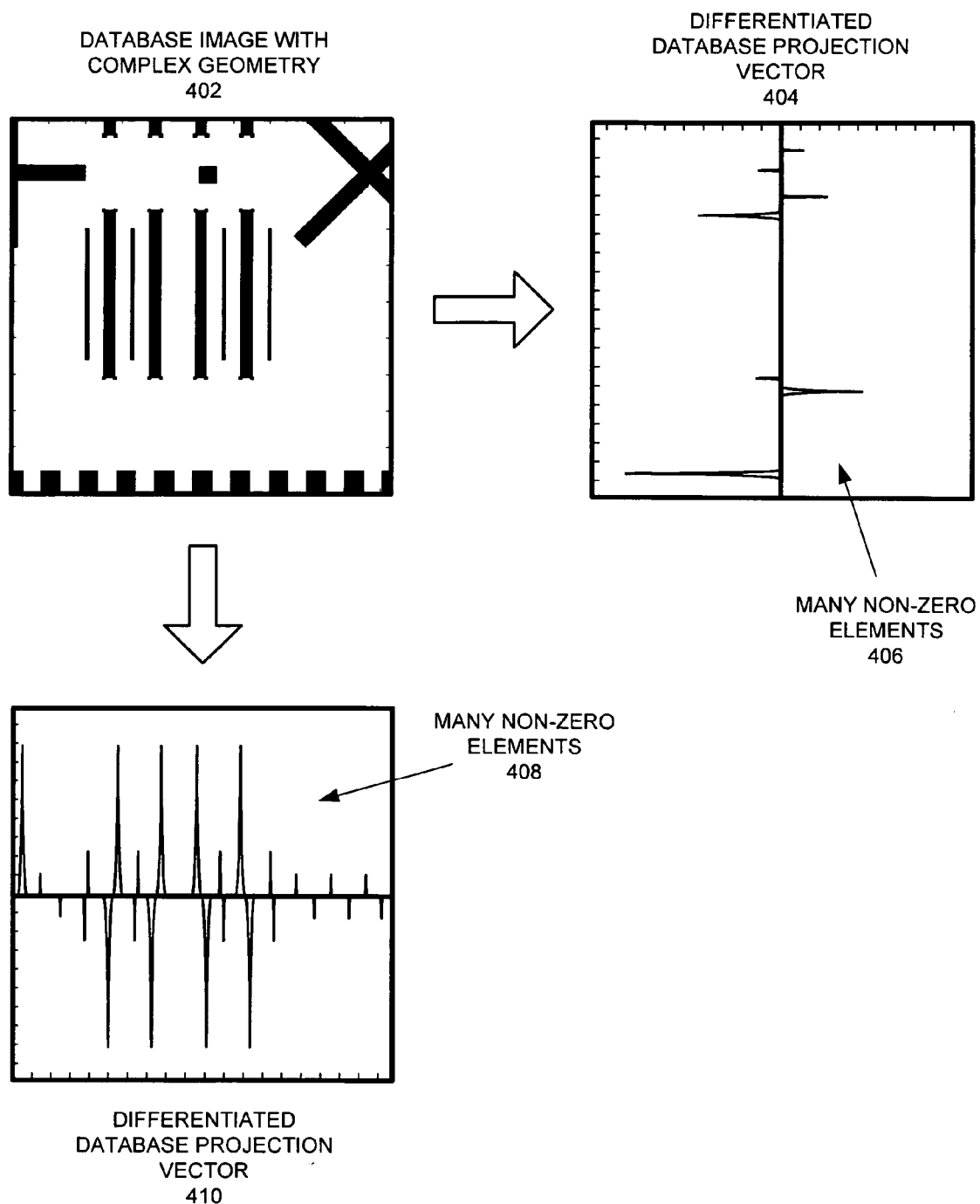
FIG. 4 illustrates a database-image with complex geometry in accordance with an embodiment of the present invention.

FIG. 4 illustrates a database-image with complex geometry 402 in accordance with an embodiment of the present invention. Note that the drawings in FIG. 4 are for illustration purposes only and do not depict an actual computation of the differentiated database-projection-vectors.

The differentiated database-projection-vector 404 is obtained by first taking an orthogonal projection of the database-image in the horizontal direction. Next, the database-projection-vector is differentiated to obtain the differentiated database-projection-vector. Note that the database-projection-vector 404 contains many non-zero elements 406. Likewise, the differentiated database-projection-vector 410 is obtained by first taking an orthogonal projection in the vertical direction and then differentiating the resulting projection vector. Note that the database-projection-vector 410 also contains many non-zero elements 408.

Note that at least one of the database-projection-vectors contains many non-zero elements. As a result, the system determines that the database-image 402 has complex geometry.

Figure 5:
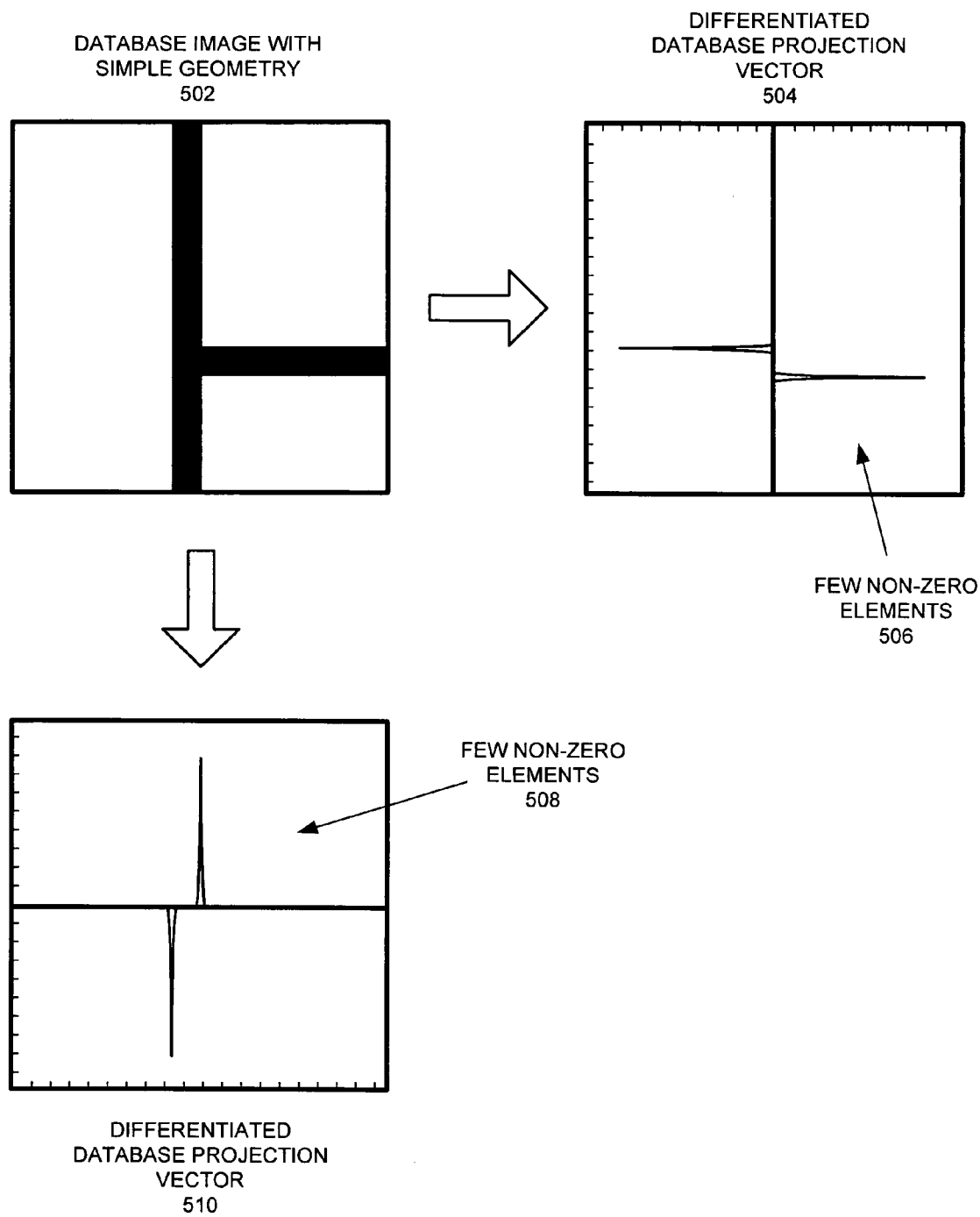
FIG. 5 illustrates a database-image with simple geometry in accordance with an embodiment of the present invention.

Conversely, FIG. 5 illustrates a database-image with simple geometry 502 in accordance with an embodiment of the present invention. Note that the drawings in FIG. 5 are for illustration purposes only and do not depict an actual computation of the differentiated database-projection-vectors.

The differentiated database-projection-vector 504 is obtained by first taking an orthogonal projection in the horizontal direction and then differentiating the resulting projection vector. Note that the differentiated database-projection-vector 504 contains few non-zero elements 506. Likewise, the differentiated database-projection-vector 510 is obtained by first taking an orthogonal projection in the vertical direction and then differentiating the resulting projection vector. Note that the differentiated database-projection-vector 510 also contains few non-zero elements 408.

Note that none of the database-projection-vectors contain many non-zero elements. As a result, the system determines that the database-image 502 has simple geometry.

If the database-image does not have complex geometry, the system computes the translational differentials using an orthogonal-projection based approach (step 710).

Otherwise, if the database-image has complex geometry, the system computes the translational differentials using a correlation-filter based approach (step 712).

Note that, if the database-image is a line-and-space pattern, the system computes the translational differentials by performing a correlation using the database-image and the polarity-enhanced-image. Specifically, the system computes these translational differentials using a correlation-filter based approach.

On the other hand, if the database-image is not a line-and-space pattern, the system computes the translational differentials by performing a correlation using the database-image and the scanned-image.

Moreover, note that the accuracy of the computed translational differentials is significantly increased because the method chooses a technique for computing the translational differentials which is suitable for the type of pattern present in the database-image. Specifically, the correlation-filter based approach is suitable if the database-image is a line-and-space pattern or has complex geometry. Conversely, the orthogonal-projection based approach is suitable if the database-image is not a line-and-space pattern and has simple geometry.

Process of Converting the Scanned-Image into a Polarity-Enhanced-Image

Figure 6:
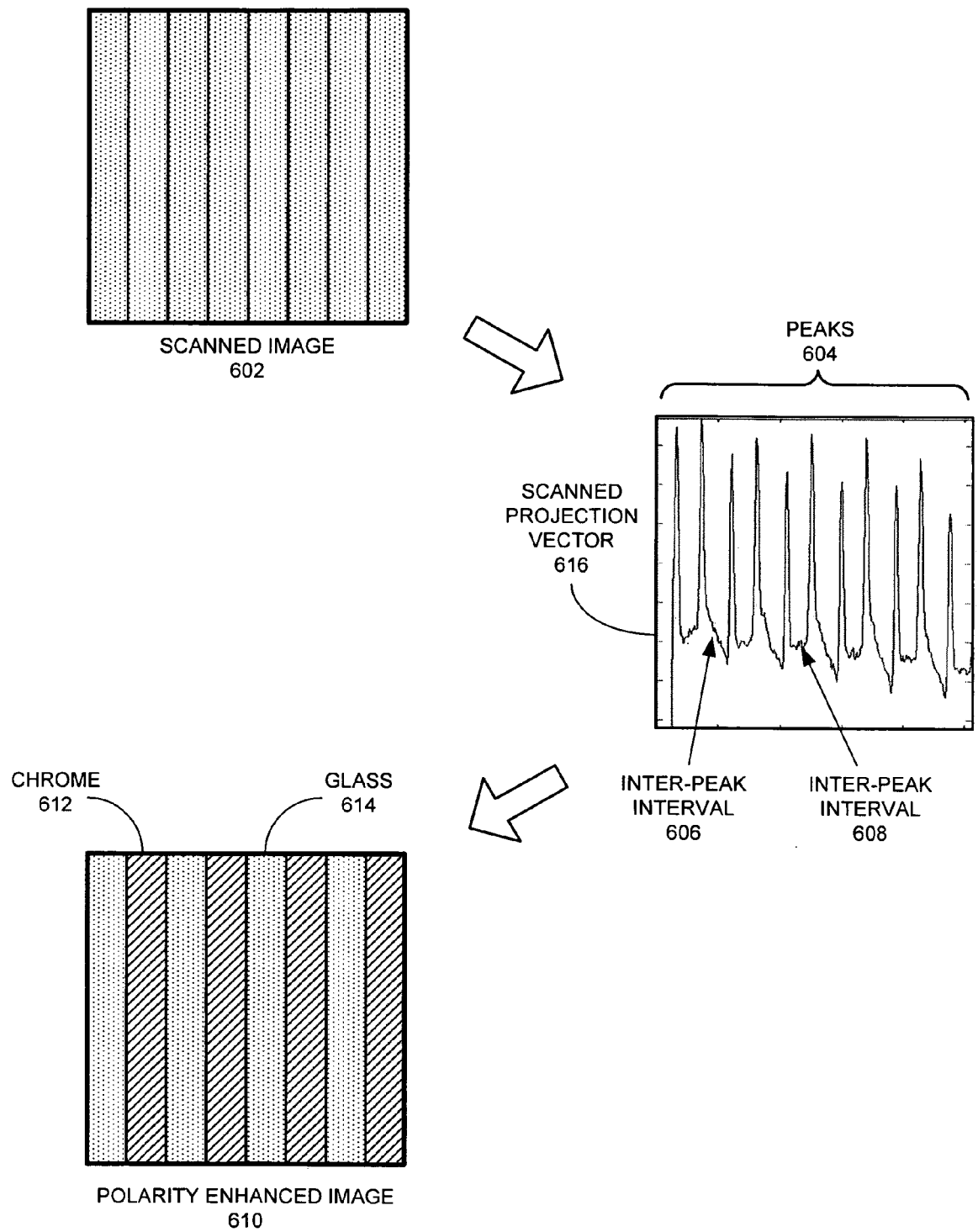
FIG. 6 illustrates a scanned-image that has a line-and-spacing pattern, a scanned-projection-vector, and a polarity-enhanced-image in accordance with an embodiment of the present invention.

FIG. 6 illustrates a scanned-image that has a line-and-spacing pattern, a scanned-projection-vector, and a polarity-enhanced-image in accordance with an embodiment of the present invention.

In one embodiment of the present invention, the scanned-image 602 is generated by a scanning-electron-microscope (SEM). Typically, in an SEM image of a line-and-space pattern, it is very difficult to distinguish lines from spaces due to low image contrast as shown in the scanned-image 602. Consequently, directly applying image registration module usually does not produce satisfactory results, especially when the line and the space have similar widths. Hence, a polarity enhancement step is required to improve the image contrast.

Figure 8:
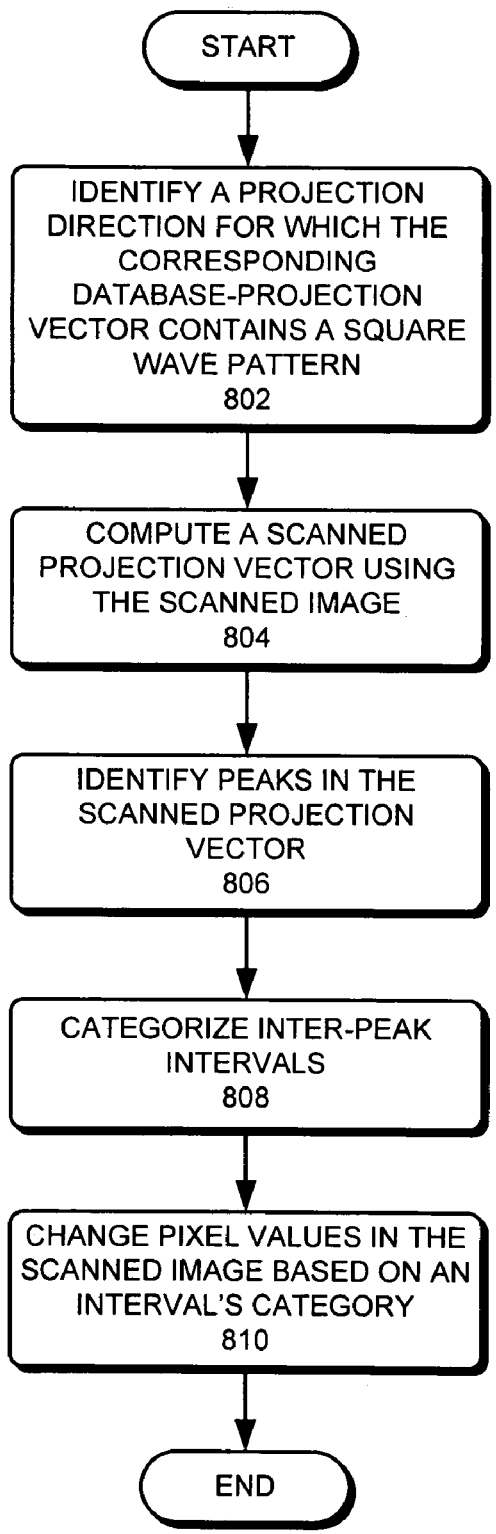
FIG. 8 presents a flowchart that illustrates the process of converting the scanned-image into a polarity-enhanced-image in accordance with an embodiment of the present invention.

FIG. 8 presents a flowchart that illustrates the process of converting the scanned-image into a polarity-enhanced-image in accordance with an embodiment of the present invention.

The process starts by identifying a projection-direction for which the corresponding database-projection-vector contains a square-wave pattern (step 802). Note that the database-projection-vector is computed using the database-image by taking an orthogonal projection along the projection-direction.

Next, the system computes a scanned-projection-vector using the scanned-image by taking an orthogonal projection along the projection-direction (step 804). For example, the system computes the scanned-projection-vector 616 using the scanned-image 602 by taking an orthogonal projection along the vertical direction.

The system then identifies peaks in the scanned-projection-vector (step 806). For example, the system identifies peaks 604 in the scanned-projection-vector 616.

Next, the system categorizes the inter-peak intervals (step 808). Specifically, the system categorizes the inter-peak intervals by comparing the values at the edges of each inter-peak interval with the average value over the inter-peak interval.

For example, the system categorizes the inter-peak intervals 606 and 608 by comparing the values at the edges of each inter-peak interval with the average value over the inter-peak interval.

Note that an SEM takes a picture of a photomask by scanning an electron beam across the photomask. When the electron beam passes over a conductor, there is no charge buildup. On the other hand, when the electron beam passes over an insulator, there is a charge buildup. As a result, an inter-peak interval, such as inter-peak interval 606, is slanted when it corresponds to an insulator, such as glass 614, on the photomask. Conversely, an inter-peak interval, such as inter-peak interval 608, is flat when it corresponds to a conductor, such as chrome 612, on the photomask.

In one embodiment of the present invention, the system categorizes the inter-peak intervals using the minimum value in each interval and the slope of each interval. Specifically, in one embodiment of the present invention, if the absolute value of the slope of the inter-peak interval is high, such as the absolute value of the slope of inter-peak interval 606, the system categorizes the interval as an insulator. On the other hand, if the absolute value of the slope of the inter-peak interval is low, such as the absolute value of the slope of the inter-peak interval 608, the system categorizes the interval as a conductor.

In another embodiment of the present invention, an interval is categorized using the minimum value and negative slope of the interval. First the system identifies peaks in the scanned-projection-vector, thereby identifying the line and space boundaries. Next, the system tentatively categorizes the inter-peak intervals into lines and spaces. In one embodiment of the present invention, the system tentatively categorizes the odd intervals as lines and the even intervals as spaces. Let the symbols $d_L^i$ and $d_S^i$ denote the minimum value for the $i^{th}$ line and $j^{th}$ space, and the symbols $S_L^i$ and $s_S^i$ denote the negative slope for the $i^{th}$ line and $j^{th}$ space. Next, the system averages the parameters extracted in all line and space intervals separately. Specifically, the system computes the average minimum value over all lines, $$d_L = \sum_i d_L^i,$$

the average minimum value over all spaces $$d_S = \sum_j d_S^j,$$

the average slope over all lines, $$s_L = \sum_i s_L^i,$$

and the average slope over all spaces, $$s_S = \sum_j s_S^j.$$

The system then computes a decision function using the averaged line and space parameters as follows:

$$f(L) = \alpha d_L + \beta s_L$$

$$f(S) = \alpha d_S + \beta s_S,$$

where $\alpha$ and $\beta$ are weighting factors.

Next, the system determines whether the tentative categorization was valid or not. Specifically, if f(L)>f(S), the tentative categorization is valid. On the other hand, if $f(L) \leq f(S)$, the tentative categorization is invalid. If the tentative categorization is invalid, the system reverses the categorization.

Finally, the system changes the pixel values in the scanned-image based on the category of the corresponding inter-peak intervals (step 810). Note that a pixel corresponds to an inter-peak interval if while taking an orthogonal projection along the projection-direction the pixel contributes to an element in the inter-peak interval.

Specifically, the image can be enhanced by adding a positive value to the pixels in the line-regions and a smaller value to the pixels in the space-regions. For example, the system can change the pixel values in the scanned-image 602 to obtain a polarity-enhanced-image 610. Note that the contrast between the chrome 612 and glass 614 regions in the polarity-enhanced-image is much more than the contrast in the scanned-image.

Correlation-Filter Based Approach

Figure 9:
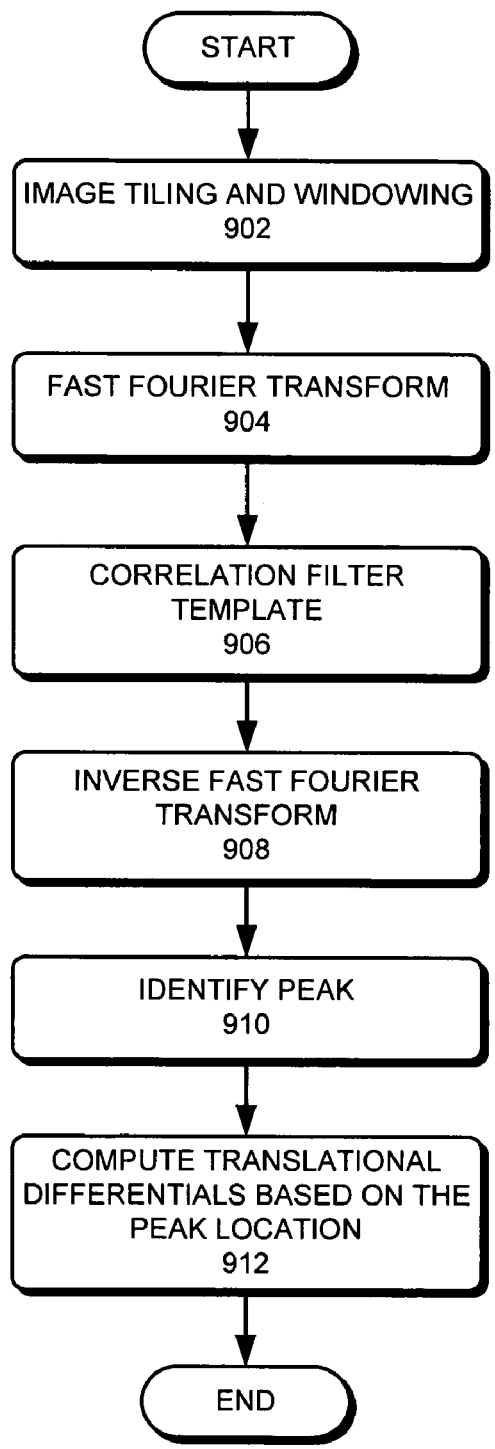
FIG. 9 presents a flowchart that illustrates the process of computing translational differentials using a correlation-filter based approach in accordance with an embodiment of the present invention.

FIG. 9 presents a flowchart that illustrates the process of computing translational differentials using a correlation-filter based approach in accordance with an embodiment of the present invention.

The process starts by tiling and windowing the scanned and database images (step 902). Note that tiling the scanned and database images results in a tiled scanned-image and a tiled database-image that contain a set of sub-images, which are decimated versions of the database image and scanned image, respectively. Specifically, in one embodiment of the present invention, the tiled scanned-image and the tiled database-image contain 4 decimated versions of the scanned image and the database image, respectively. Furthermore, windowing each sub-image in the tiled scanned-image and tiled database-image results in a windowed scanned-image and a windowed database-image, respectively.

Next, the system applies a fast-Fourier-transform (FFT) to the windowed scanned-image to obtain a transformed-image (step 904).

The system then applies a correlation-filter-template to the transformed image to obtain a filtered-image (step 906).

It will be evident to one skilled in the art that a variety of correlation-filter-templates can be applied to the transformed-image to obtain the filtered-image.

Specifically, in one embodiment of the present invention, applying the correlation-filter-template involves applying an unconstrained optimal trade-off synthetic discrimination function (UOTSDF) correlation filter. Specifically, applying the UOTSDF correlation filter to the transformed-image to obtain the filtered-image can be expressed as $F_T^{CF} = F_T^S \bullet / (p+D)$, where $F_T^{CF}$ is the filtered-image, $F_T^S$ is the transformed-image, $$p = \frac{1}{m \times n} \sum_{i=1}^{m} \sum_{j=1}^{n} D(i, j),$$

and $D = |F_T^S|$. (Note that the symbol "$\bullet /$" represents element-wise division between two matrices.)

An intuitive explanation of how the above correlation-filter-template works is as follows. The m×n matrix, D, is essentially the amplitude of $F_T^S$, the FFT of the scanned-image. Dividing $F_T^S$ by D will result in a matrix that contains the phase of the scanned-image. Note that the phase-only correlation filters can sharpen correlation peaks and reduce side lobes caused by the image signal itself. However, one of the drawbacks of phase-only correlation filters is that they are too sensitive to phase distortions in the images. The trade-off factor p prevents the correlation filter from going to the extreme. It is well known in the art that a scanned-image can faithfully reproduce the edges of the database-image, even when the amplitude of the image is significantly distorted. Hence, it makes sense to emphasize the edge information, which is typically contained in the phase information of the FFT matrix. Furthermore, note that the trade-off factor, p, helps to provide robustness against edge distortions in the scanned-image and also against additive imaging noise.

Next, the system performs an inverse-fast-Fourier-transform using the filtered-image and a Fourier-transform of the windowed database-image to obtain a correlation-function (step 908).

Specifically, in one embodiment of the present invention, performing the inverse-fast-Fourier-transform using the filtered-image and the fast-Fourier-transform of the database-image to obtain a correlation-filter based correlation function can be expressed as follows:

$$C_{CF} = \text{IFFT2}(F_T^{CF} \times \text{conj}(F_T^D)),$$

where $C_{CF}$ is the 2-D correlation function, $F_T^{CF}$ is the filtered-image, and $F_T^D$ is the fast-Fourier-transform of the windowed database-image. Note that "IFFT2" and "conj" denote the inverse 2-D FFT and conjugation operations, respectively.

The system then identifies a peak in the correlation function (step 910).

Finally, the system computes the translational differentials based on the peak location (step 912).

Specifically, in one embodiment of the present invention, if the peak location is at $(x_p, y_p)$, the translational differentials, dx and dy can be computed as follows:

$$dx = 2 \times \left(x_p - \frac{N}{2} - 1\right)$$

$$dy = 2 \times \left(y_p - \frac{M}{2} - 1\right),$$

where the factor 2 is used to compensate for the decimation that occurred during image tiling, and M and N are the image sizes.

Orthogonal-Projection Based Approach

Figure 10A:
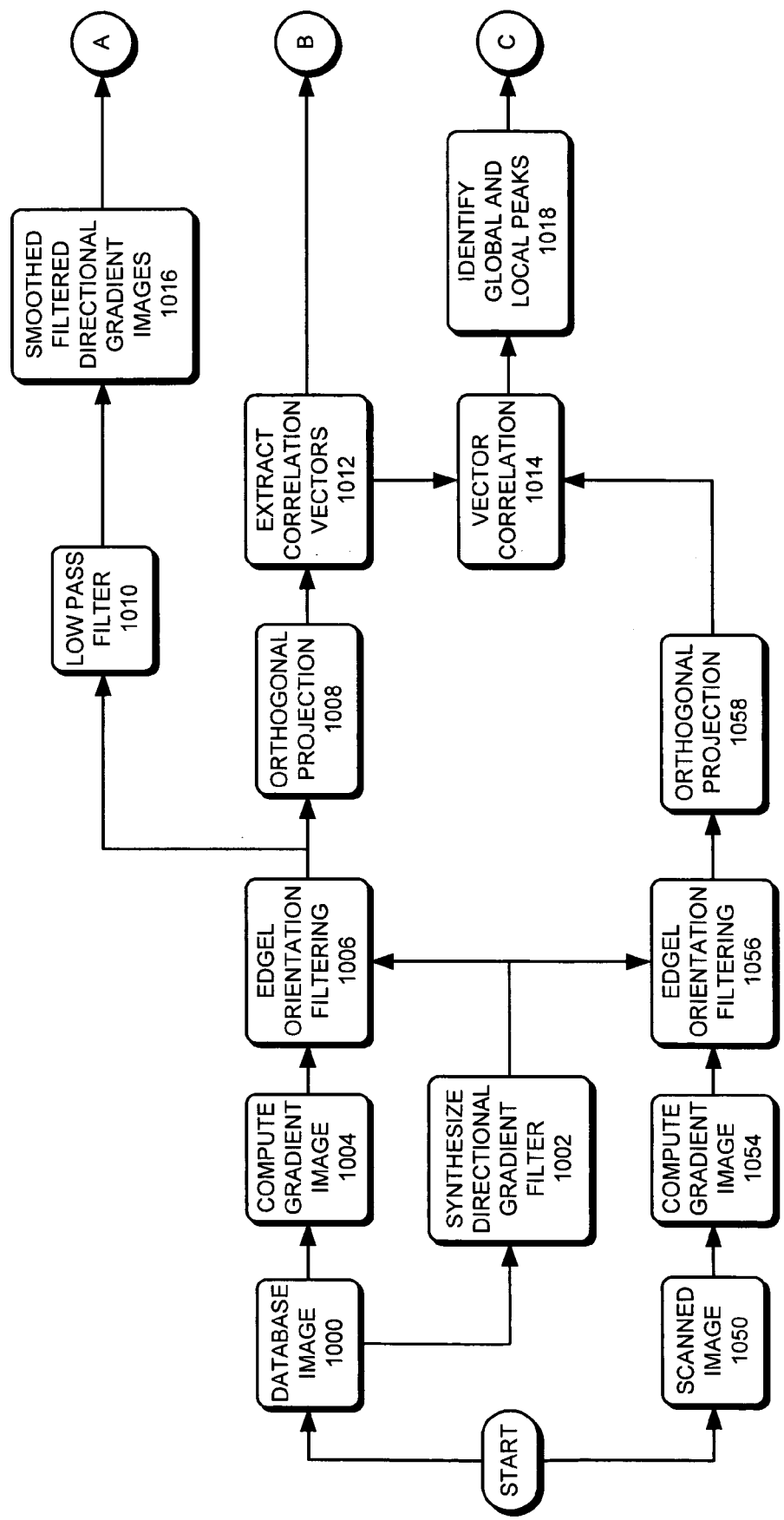
FIG. 10A and FIG. 10B present flowcharts that illustrate the process for computing the translational differentials using an orthogonal-projection based approach in accordance with an embodiment of the present invention.
Figure 10B:
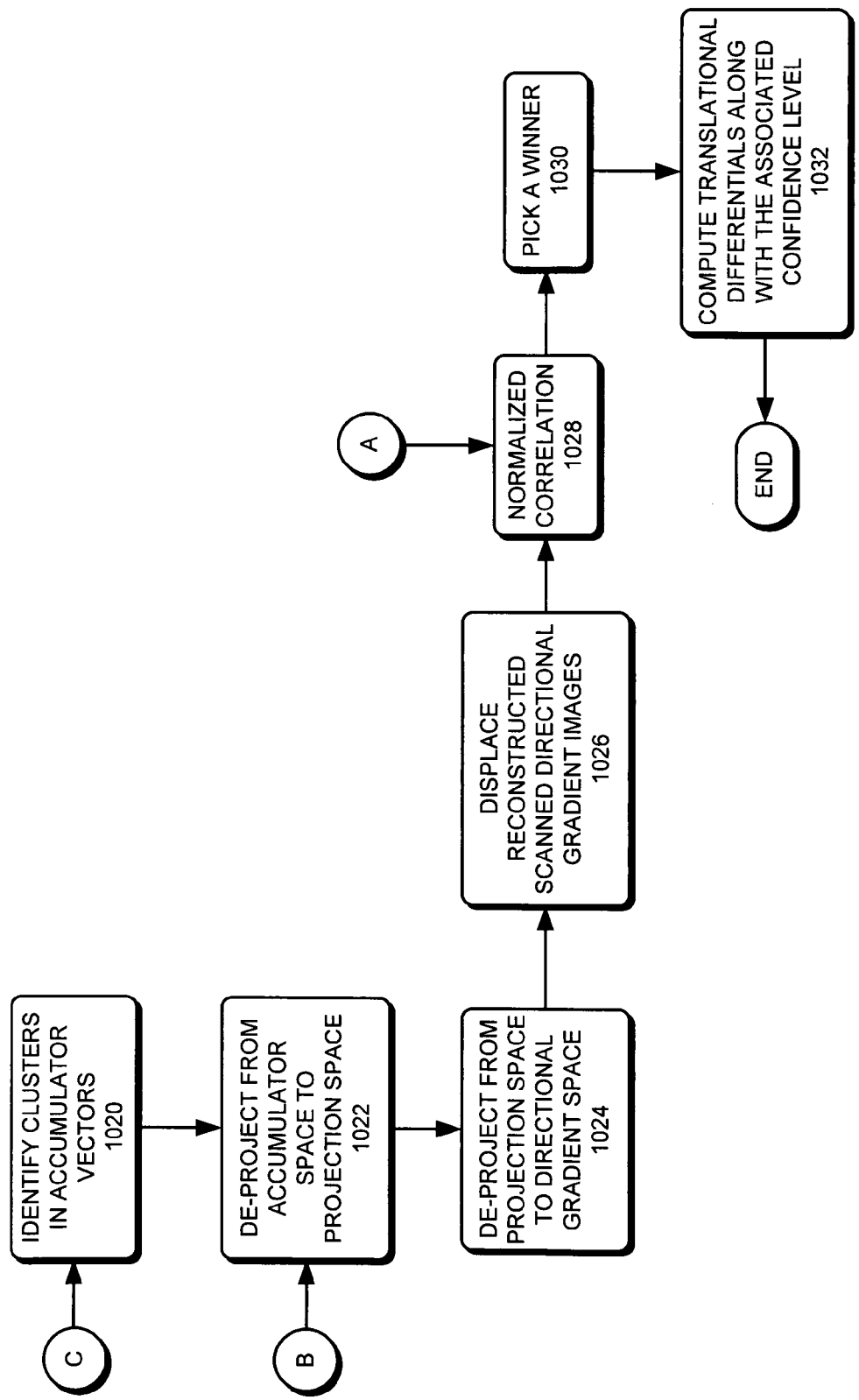

FIG. 10A and FIG. 10B present flowcharts that illustrate the process for computing the translational differentials using an orthogonal-projection based approach in accordance with an embodiment of the present invention.

The process begins by synthesizing a directional-gradient filter (step 1002). Specifically, in one embodiment of the present invention, the directional-gradient filter is synthesized using the database image 1000. In another embodiment of the present invention, the directional-gradient filter is synthesized based on user input. Note that the directional-gradient filter can be used to attenuate edgels that do not conform to the directional gradients of feature edges in the database image.

The system then computes a raw database gradient-image and a raw scanned gradient-image using the database image 1000 and the scanned image 1050, respectively (steps 1004 and 1054).

Specifically, the system first converts the database image and the scanned image into a set of database directional-gradient-images and a set of scanned directional-gradient-images, respectively. The system then computes the raw database gradient-image and the raw scanned gradient-image using the set of database directional gradient-images and the set of scanned directional gradient-images, respectively.

Next, the system filters edgel orientations in the raw database gradient-image and raw scanned gradient-image by applying the gradient-directional filter (steps 1006 and 1056). This step results in a database gradient-image and a scanned gradient-image.

The system then computes database projection-vectors from the database gradient-image and scanned projection-vectors from the scanned gradient-image by taking orthogonal projections along a set of directions (steps 1008 and 1058). Specifically, in one embodiment of the present invention, the system projects the pixels of the database gradient-image and the scanned gradient-image along virtual rays orthogonal to their direction and integrates them into elements of a multivariate projection vector. Note that if the features in the integrated circuit are rectilinear, the orthogonal projections can be taken in the horizontal and vertical directions. Moreover, in this case, the horizontal projection vector will have a dimension equal to the image width and the vertical projection vector will have a dimension equal to the image height.

Next, the system extracts correlation vectors from the database projection-vectors (step 1012). In one embodiment of the present invention, the projection vectors are one-dimensional. Consequently, the correlation vectors can assume one of two possible directions: either towards the first element of the projection vector or away from it. Specifically, in one embodiment of the present invention, the vector correlations are directed towards the first element of the corresponding projection vectors.

The system then maps the scanned projection-vectors to obtain the accumulator vectors using vector correlation (step 1014). Note that, vector correlation uses the correlation vectors to perform the mapping from the projection space to the accumulator space. Furthermore, in one embodiment of the present invention, the system can employ a generalized Hough transform to map the scanned projection-vectors to obtain accumulator-vectors in an accumulator space by using the correlation vectors.

Next, the system detects global and local peaks in the accumulation space (step 1018). In one embodiment of the present invention, a primary and a secondary accumulator vector is created for each accumulator direction. Furthermore, in one embodiment of the present invention, the primary and secondary accumulator vectors undergo different amounts of smoothing. Specifically, in one embodiment of the present invention, the secondary accumulator vector undergoes a higher degree of smoothing than the primary accumulator vector. Next, the system identifies a global and two local peaks in the primary accumulator vector. Additionally, the system identifies only a global peak in the secondary accumulator vector.

Note that the location of each global or local peak represents a candidate translational differential. Hence, by identifying global and local peaks in the accumulator vectors, the system obtains a set of candidate translational differentials in each accumulator direction. In one embodiment of the present invention, the system obtains 4 candidate translational differentials in the horizontal and the vertical directions. In this way, the system obtains a total of 16 candidate translational differentials that are derived by taking the cross-product between the set of horizontal translational-differentials and the set of vertical translational-differentials.

The system then identifies peak-cluster locations in the accumulator space (step 1020). Note that a peak cluster is a collection of contiguous elements around a peak (including the peak). In one embodiment of the present invention, the peak-clusters are identified based on the global and local peaks.

Next, the system de-projects the accumulator-vectors to the projection space to obtain reconstructed scanned-projection-vectors (step 1022). Note that the system uses the correlation vectors to perform the de-projection.

The system then de-projects the scanned-projection-vectors to the directional-gradient-image space to obtain reconstructed directional gradient-images (step 1024).

In one embodiment of the present invention, the system suppresses all elements in the reconstructed scanned-projection-vectors except those that contribute to the peak-clusters in the accumulator space. Next, the system de-projects these reconstructed scanned-projection-vectors to the directional-gradient-image space. By doing this, the reconstructed directional-gradient-images can have a higher signal-to-noise ratio than the original directional-gradient-images that were obtained directly from the scanned image.

Next, the system generates one or more sets of translated directional-gradient-images using the set of candidate-translational-differentials (step 1026). In one embodiment of the present invention, the system generates 16 sets of translated directional-gradient-images, wherein each set includes a translated horizontal-gradient-image and a translated vertical-gradient-image. Note that each of the 16 sets of translated directional-gradient-images corresponds to the set of 16 candidate translational-differentials that were obtained by taking the cross-product of the set of candidate horizontal translational-differentials and the set of candidate vertical translational-differentials.

Furthermore, the system generates a set of directional-gradient-images based on the database gradient-image that is generated in step 1006. Moreover, note that the database gradient-image that is generated in step 1006 has already been passed through the directional-gradient filter. Next, the system applies a low-pass filter to the set of directional-gradient-images to obtain a set of smoothed directional-gradient-images (steps 1010 and 1016).

The system then performs a normalized correlation between the set of smoothed directional-gradient-images and the one or more sets of translated directional-gradient-images (step 1028). Note that the value of the normalized correlation can be viewed as a "figure of merit" that indicates the confidence of the match between the two sets of images.

Next, the system picks a winner out of the one or more sets of translated directional-gradient-images (step 1030). In one embodiment of the present invention, the set of translated directional-gradient-images that results in the maximum aggregate correlation is chosen as the winner. It will be apparent to one skilled in the art that a variety of decision functions can be used to pick a winner out of the one or more sets of translated directional-gradient-images.

Finally, the system computes the translational differentials along with the associated confidence level based on the winning set of translated directional-gradient-images (step 1032).

Process of Synthesizing a Directional Gradient Filter

Figure 11:
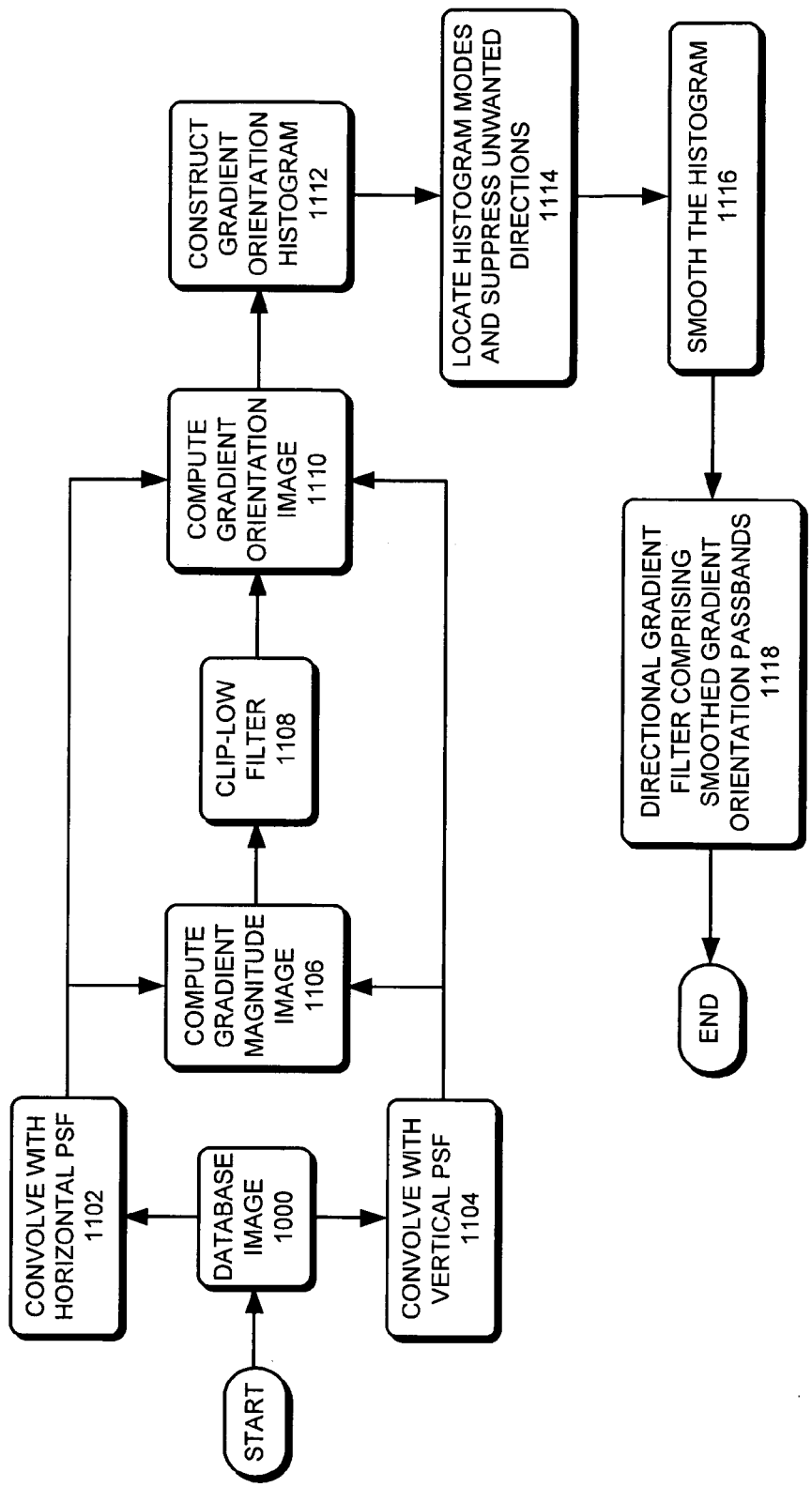
FIG. 11 presents a flowchart that illustrates the process of synthesizing a directional gradient filter.

FIG. 11 presents a flowchart that illustrates the process of synthesizing a directional gradient filter.

The process starts by the system convolving the database image 1000 with a horizontal and a vertical point spread function (PSF) to obtain a horizontal gradient-image and a vertical gradient-image, respectively (steps 1102 and 1104).

The system then computes a gradient magnitude image using the horizontal gradient-image and the vertical gradient-image (step 1106).

Next, the system applies a clip-low filter to the gradient magnitude image (step 1108). Note that the clip-low filter suppresses the pixels in the gradient magnitude image that contain a value below an adaptive threshold, which is derived by computing a fraction of the mean gradient magnitude image. It will be apparent to one skilled in the art that a variety of functions can be used to derive the adaptive threshold based on the gradient magnitude image.

The system then computes a gradient orientation image using the remaining pixels, i.e., using the pixels whose gradient magnitude is above the adaptive threshold (step 1110).

Next, the system constructs a gradient orientation histogram using the gradient orientation image (step 1112).

The system then identifies the modes in the histogram (which correspond to the desired directions) and suppresses the other bins (which correspond to the unwanted directions) (step 1114).

Next, the system smoothes the histogram (step 1116).

Finally, the system constructs the directional gradient-filter using the smoothed histogram (step 1118).

Process of Applying a Directional Gradient Filter

Figure 12:
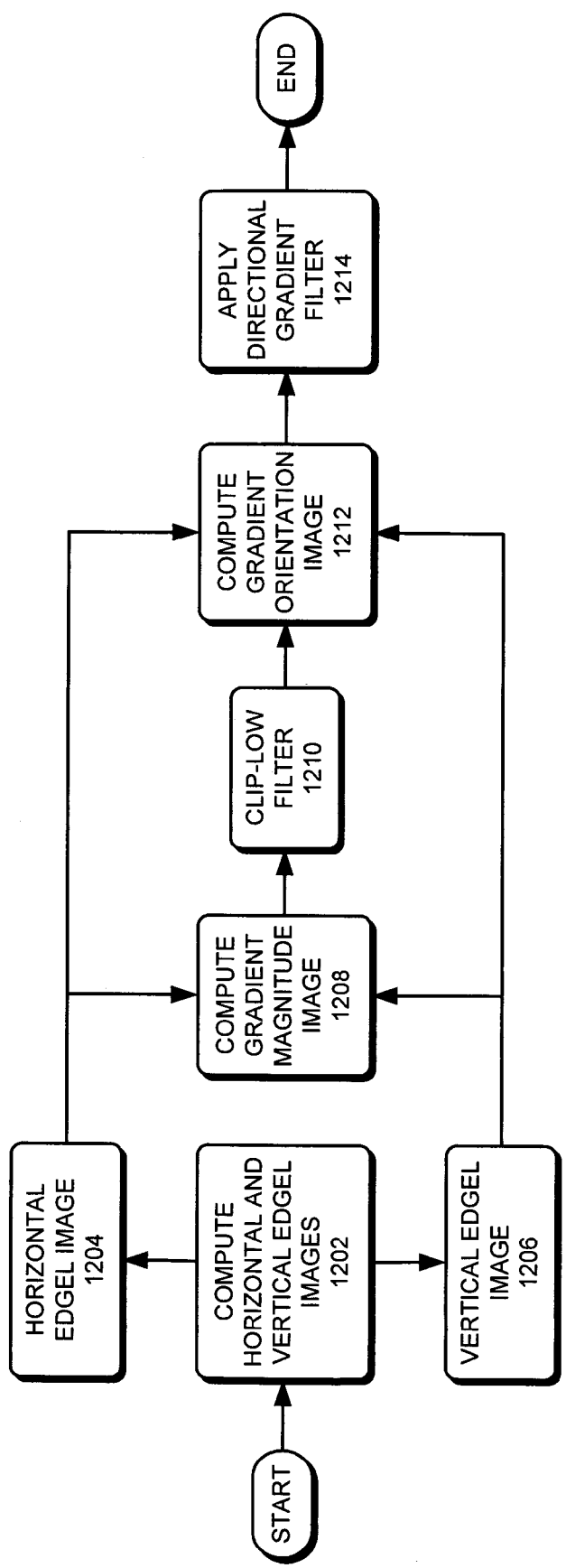
FIG. 12 presents a flowchart that illustrates the process of applying a directional gradient filter to an image.

FIG. 12 presents a flowchart that illustrates the process of applying a directional gradient filter to an image.

The system starts by computing a horizontal gradient-image and a vertical gradient-image of an image (steps 1202-1206).

Note that the horizontal gradient-image and the vertical gradient-image can be generated by convolving the image with a horizontal PSF and a vertical PSF, respectively. It will be apparent to one skilled in the art that a variety of PSFs can be used for generating the directional gradient-images. Specifically, in one embodiment of the present invention, the database directional-gradient-images are generated by convolving the database image with a Sobel kernel. Furthermore, the scanned directional-gradient-images are generated by convolving the scanned image with the first derivative of a Gaussian. Note that in both cases, the convolution is performed in the vertical and the horizontal directions.

Next, the system computes the gradient-magnitude image from the horizontal gradient-image and the vertical gradient-image (step 1208).

The system then applies a clip-low filter to the gradient magnitude image (step 1210). Note that the clip-low filter suppresses the pixels in the gradient magnitude image that contain a value below an adaptive threshold, which is derived by computing a fraction of the mean gradient magnitude image. It will be apparent to one skilled in the art that a variety of functions can be used to derive the adaptive threshold based on the gradient magnitude image.

Next, the system computes a gradient orientation image using the remaining pixels, i.e., using the pixels whose value of the gradient magnitude is above the adaptive threshold (step 1212).

Finally, the system applies the directional gradient filter to the gradient orientation image to obtain the filtered image (step 1214).

CONCLUSION

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

Furthermore, the data structures and code described in this detailed description are typically stored on a computer-readable storage medium, which may be any type of device or medium that can store code and/or data for use by a computer system. This includes, but is not limited to, magnetic and optical storage devices such as disk drives, magnetic tape, CDs (compact discs) and DVDs (digital versatile discs or digital video discs), and computer instruction signals embodied in a transmission medium (with or without a carrier wave upon which the signals are modulated). For example, the transmission medium may include a communications network, such as the Internet.

What is claimed is:

1. A method for computing translational differentials between a database-image and a scanned-image of a photomask, the method comprising:
   receiving the database-image that is noise free and the scanned-image that is generated by an imaging process;
   determining whether the database-image is a line-and-space pattern;
   if the database-image is a line-and-space pattern,
      converting the scanned-image into a polarity-enhanced-image; and
      computing translational differentials by performing a correlation using the database-image and the polarity-enhanced-image;
   otherwise, if the database-image is not a line-and-space pattern, computing translational differentials by performing a correlation using the database-image and the scanned-image;
   wherein accuracy of the computed translational differentials is significantly increased because the method chooses a technique for computing the translational differentials which is suitable for a type of pattern present in the database-image.

2. The method of claim 1, wherein the determining whether the database-image is a line-and-space pattern involves:
   computing database-projection-vectors using the database-image by taking orthogonal projections along a set of directions; and
   determining whether only one of the computed database-projection-vectors contains a square-wave pattern, while other computed database-projection vectors contain a straight line.

3. The method of claim 1, wherein the converting the scanned-image into a polarity-enhanced-image involves:
   identifying a projection-direction for which a corresponding database-projection-vector contains a square-wave pattern, wherein the corresponding database-projection-vector is computed using the database-image by taking an orthogonal projection along the projection-direction;

computing a scanned-projection-vector using the scanned-image by taking an orthogonal projection along the projection-direction;

identifying peaks in the computed scanned-projection-vector;

categorizing an inter-peak interval by comparing values at the edges of the inter-peak interval with an average value over the inter-peak interval; and changing a value of a pixel in the scanned-image based on the category of a corresponding inter-peak interval, wherein a pixel corresponds to an inter-peak interval if, while taking an orthogonal projection along the projection-direction, the pixel contributes to an element in the inter-peak interval.

4. The method of claim 1, wherein the computing translational differentials by performing a correlation using the database-image and the scanned-image involves:

determining whether the database-image has a complex geometry;

if the database-image has a complex geometry, computing translational differentials using a correlation-filter based approach;

otherwise, if the database image does not have a complex geometry, computing translational differentials using an orthogonal-projection based approach.

5. The method of claim 4, wherein the determining whether the database-image has a complex geometry involves:

computing database-projection-vectors using the database-image by taking orthogonal projections along a set of directions;

differentiating the database-projection-vectors to obtain differentiated database-projection-vectors; and determining whether one or more of said differentiated database-projection-vectors contain many non-zero elements.

6. The method of claim 4, wherein the computing translational differentials using a correlation-filter based approach involves:

tiling the scanned image and the database image to obtain a tiled scanned-image and a tiled database-image, respectively, wherein the tiled scanned-image contains a set of sub-images which are decimated versions of the scanned image and the tiled database-image contains a set of sub-images which are decimated versions of the database image;

converting the tiled scanned-image and the tiled database-image into a windowed scanned-image and a windowed database-image, respectively, by windowing each sub-image in the tiled scanned-image and the tiled database-image;

applying a fast-Fourier-transform to the windowed scanned-image to obtain a transformed-image;

applying a correlation-filter-template to the transformed-image to obtain a filtered-image;

performing an inverse-fast-Fourier-transform using the filtered-image and a fast-Fourier-transform of the windowed database-image to obtain a correlation-function;

identifying a peak in the correlation-function; and computing the translational differentials based on location of the identified peak.

7. The method of claim 4, wherein the computing translational differentials using an orthogonal-projection based approach involves:

computing a set of candidate-translational-differentials using the database-image and the scanned-image;

generating one or more sets of translated directional-gradient-images based on the set of candidate-translational-differentials and using the database-image and the scanned-image;

converting the database-image into a set of smoothed directional-gradient-images; and computing the translational differentials by performing a normalized correlation using the set of smoothed directional-gradient-images and the one or more sets of translated directional-gradient-images;

wherein computational time is significantly reduced because the method performs normalized correlation using the set of candidate-translational-differentials, instead of exhaustively performing normalized correlation using all possible translational differentials.

8. The method of claim 7, wherein the computing a set of candidate-translational-differentials using the database-image and the scanned-image involves:

converting the database-image and the scanned-image into a database-gradient-image and a scanned-gradient-image, respectively;

computing database-projection-vectors from the database-gradient-image and scanned-projection-vectors from the scanned-gradient-image by taking orthogonal projections along a set of directions;

extracting correlation-vectors from the computed database-projection-vectors;

mapping the scanned-projection-vectors to obtain accumulator-vectors in an accumulator space by using the correlation-vectors; and computing a set of candidate-translational-differentials based on peak-cluster locations in the accumulator space, wherein a peak-cluster is a collection of contiguous elements around a peak (including the peak).

9. The method of claim 8, wherein the converting the database-image and the scanned-image into a database-gradient-image and a scanned-gradient-image involves:

creating a directional-gradient filter using the database-image, wherein the directional-gradient filter can be used to attenuate edgels that do not conform to directional gradients of feature edges in the database-image;

converting the database-image and the scanned-image into a set of database directional-gradient-images and a set of scanned directional-gradient-images, respectively;

generating a raw database-gradient-image and a raw scanned-gradient-image from the set of database directional-gradient-images and the set of scanned directional-gradient-images, respectively; and applying the directional-gradient filter to the raw database-gradient-image and the raw scanned-gradient-image to obtain the database-gradient-image and the scanned-gradient-image, respectively.

10. The method of claim 8, wherein the generating one or more sets of translated directional-gradient-images based on the set of candidate-translational-differentials involves:

de-projecting only cluster-peaks in the accumulator-vectors to obtain reconstructed scanned-projection-vectors;

de-projecting the reconstructed scanned-projection-vectors to obtain reconstructed directional-gradient-images; and generating one or more sets of translated directional-gradient-images by displacing the reconstructed directional-gradient-images using the set of candidate-translational-differentials;

wherein de-projecting only the cluster-peaks improves signal-to-noise ratio of the reconstructed directional-gradient-images.

11. The method of claim 9, wherein the creating a directional-gradient filter involves:

convolving the database-image with a horizontal and a vertical Point Spread Function (PSF) to generate a horizontal edgel-image and a vertical edgel-image, respectively;

computing a gradient-magnitude-image using the horizontal edgel-image and the vertical edgel-image;

applying a clip-low filter to the gradient-magnitude-image to obtain a clipped-gradient-image;

generating a histogram using gradient orientations in the clipped-gradient-image; and creating the directional-gradient filter using the histogram.

12. The method of claim 7, wherein the converting the database-image into a set of smoothed directional-gradient-images involves:

converting the database-gradient-image into a set of unsmoothed directional-gradient-images; and applying a low-pass filter to the set of unsmoothed directional-gradient-images to obtain the set of smoothed directional-gradient-images.

13. A method for computing translational differentials between a database-image and a scanned-image of a photomask, the method comprising:

receiving the database-image that is noise free and the scanned-image that is generated by an imaging process;

determining whether the database-image has a complex geometry;

determining whether the database-image is a line-and-space pattern;

if the database-image is a line-and-space pattern,
converting the scanned-image into a polarity-enhanced-image; and
computing translational differentials by performing a correlation using the database-image and the polarity-enhanced-image;

otherwise, if the database-image is not a line-and-space pattern, but has a complex geometry, computing translational differentials using a correlation-filter based approach using the database-image and the scanned-image;

otherwise, if the database-image is not a line-and-space pattern and does not have a complex geometry, computing translational differentials using an orthogonal-projection based approach using the database-image and the scanned-image;

wherein accuracy of the computed translational differentials is significantly increased because the method chooses a technique for computing the translational differentials which is suitable for a type of pattern present in the database-image.

14. A computer-readable storage medium storing instructions that, when executed by a computer, cause the computer to perform a method for computing translational differentials between a database-image and a scanned-image of a photomask, the method comprising:

receiving the database-image that is noise free and the scanned-image that is generated by an imaging process;

determining whether the database-image is a line-and-space pattern;

if the database-image is a line-and-space pattern,
converting the scanned-image into a polarity-enhanced-image; and
computing translational differentials by performing a correlation using the database-image and the polarity-enhanced-image;

otherwise, if the database-image is not a line-and-space pattern, computing translational differentials by performing a correlation using the database-image and the scanned-image;

wherein accuracy of the computed translational differentials is significantly increased because the method chooses a technique for computing the translational differentials which is suitable for a type of pattern present in the database-image.

15. The computer-readable storage medium of claim 14, wherein the determining whether the database-image is a line-and-space pattern involves:

computing database-projection-vectors using the database-image by taking orthogonal projections along a set of directions; and determining whether only one of the computed database-projection-vectors contains a square-wave pattern, while other computed database-projection vectors contain a straight line.

16. The computer-readable storage medium of claim 14, wherein the converting the scanned-image into a polarity-enhanced-image involves:

identifying a projection-direction for which a corresponding database-projection-vector contains a square-wave pattern, wherein the corresponding database-projection-vector is computed using the database-image by taking an orthogonal projection along the projection-direction;

computing a scanned-projection-vector using the scanned-image by taking an orthogonal projection along the projection-direction;

identifying peaks in the computed scanned-projection-vector;

categorizing an inter-peak interval by comparing values at the edges of the inter-peak interval with an average value over the inter-peak interval; and changing a value of a pixel in the scanned-image based on the category of a corresponding inter-peak interval, wherein a pixel corresponds to an inter-peak interval if, while taking an orthogonal projection along the projection-direction, the pixel contributes to an element in the inter-peak interval.

17. The computer-readable storage medium of claim 14, wherein the computing translational differentials by performing a correlation using the database-image and the scanned-image involves:

determining whether the database-image has a complex geometry;

if the database-image has a complex geometry, computing translational differentials using a correlation-filter based approach;

otherwise, if the database image does not have a complex geometry, computing translational differentials using an orthogonal-projection based approach.

18. The computer-readable storage medium of claim 17, wherein the determining whether the database-image has a complex geometry involves:
- computing database-projection-vectors using the database-image by taking orthogonal projections along a set of directions;
- differentiating the database-projection-vectors to obtain differentiated database-projection-vectors; and
- determining whether one or more of said differentiated database-projection-vectors contain many non-zero elements.

19. The computer-readable storage medium of claim 17, wherein the computing translational differentials using a correlation-filter based approach involves:
- tiling the scanned image and the database image to obtain a tiled scanned-image and a tiled database-image, respectively, wherein the tiled scanned-image contains a set of sub-images which are decimated versions of the scanned image and the tiled database-image contains a set of sub-images which are decimated versions of the database image;
- converting the tiled scanned-image and the tiled database-image into a windowed scanned-image and a windowed database-image, respectively, by windowing each sub-image in the tiled scanned-image and the tiled database-image;
- applying a fast-Fourier-transform to the windowed scanned-image to obtain a transformed-image;
- applying a correlation-filter-template to the transformed-image to obtain a filtered-image;
- performing an inverse-fast-Fourier-transform using the filtered-image and a fast-Fourier-transform of the windowed database-image to obtain a correlation-function;
- identifying a peak in the correlation-function; and
- computing the translational differentials based on location of the identified peak.

20. The computer-readable storage medium of claim 17, wherein the computing translational differentials using an orthogonal-projection based approach involves:
- computing a set of candidate-translational-differentials using the database-image and the scanned-image;
- generating one or more sets of translated directional-gradient-images based on the set of candidate-translational-differentials and using the database-image and the scanned-image;
- converting the database-image into a set of smoothed directional-gradient-images; and
- computing the translational differentials by performing a normalized correlation using the set of smoothed directional-gradient-images and the one or more sets of translated directional-gradient-images;
- wherein computational time is significantly reduced because the method performs normalized correlation using the set of candidate-translational-differentials, instead of exhaustively performing normalized correlation using all possible translational differentials.

21. The computer-readable storage medium of claim 20, wherein the computing a set of candidate-translational-differentials using the database-image and the scanned-image involves:
- converting the database-image and the scanned-image into a database-gradient-image and a scanned-gradient-image, respectively;
- computing database-projection-vectors from the database-gradient-image and scanned-projection-vectors from the scanned-gradient-image by taking orthogonal projections along a set of directions;
- extracting correlation-vectors from the computed database-projection-vectors;
- mapping the scanned-projection-vectors to obtain accumulator-vectors in an accumulator space by using the correlation-vectors; and
- computing a set of candidate-translational-differentials based on peak-cluster locations in the accumulator space, wherein a peak-cluster is a collection of contiguous elements around a peak (including the peak).

22. The computer-readable storage medium of claim 21, wherein the converting a database-image and a scanned-image into the database-gradient-image and the scanned-gradient-image involves:
- creating a directional-gradient filter using the database-image, wherein the directional-gradient filter can be used to attenuate edgels that do not conform to directional gradients of feature edges in the database-image;
- converting the database-image and the scanned-image into a set of database directional-gradient-images and a set of scanned directional-gradient-images, respectively;
- generating a raw database-gradient-image and a raw scanned-gradient-image from the set of database directional-gradient-images and the set of scanned directional-gradient-images, respectively; and
- applying the directional-gradient filter to the raw database-gradient-image and the raw scanned-gradient-image to obtain the database-gradient-image and the scanned-gradient-image, respectively.

23. The computer-readable storage medium of claim 21, wherein the generating one or more sets of translated directional-gradient-images based on the set of candidate-translational-differentials involves:
- de-projecting only cluster-peaks in the accumulator-vectors to obtain reconstructed scanned-projection-vectors;
- de-projecting the reconstructed scanned-projection-vectors to obtain reconstructed directional-gradient-images; and
- generating one or more sets of translated directional-gradient-images by displacing the reconstructed directional-gradient-images using the set of candidate-translational-differentials;
- wherein de-projecting only the cluster-peaks improves signal-to-noise ratio of the reconstructed directional-gradient-images.

24. The computer-readable storage medium of claim 22, wherein the creating a directional-gradient filter involves:
- convolving the database-image with a horizontal and a vertical Point Spread Function (PSF) to generate a horizontal edgel-image and a vertical edgel-image, respectively;
- computing a gradient-magnitude-image using the horizontal edgel-image and the vertical edgel-image;
- applying a clip-low filter to the gradient-magnitude-image to obtain a clipped-gradient-image;
- generating a histogram using the-gradient orientations in the clipped-gradient-image; and
- creating the directional-gradient filter using the histogram.

25. The computer-readable storage medium of claim 20, wherein the converting the database-image into a set of smoothed directional-gradient-images involves:
- converting the database-gradient-image into a set of unsmoothed directional-gradient-images; and applying a low-pass filter to the set of unsmoothed directional-gradient-images to obtain the set of smoothed directional-gradient-images.

26. A computer-readable storage medium storing instructions that when executed by a computer cause the computer to perform a method for computing translational differentials between a database-image and a scanned-image of a photomask, the method comprising:

receiving the database-image that is noise free and the scanned-image that is generated by an imaging process;

determining whether the database-image has a complex geometry;

determining whether the database-image is a line-and-space pattern;

if the database-image is a line-and-space pattern,
converting the scanned-image into a polarity-enhanced-image; and
computing translational differentials by performing a correlation using the database-image and the polarity-enhanced-image;

otherwise, if the database-image is not a line-and-space pattern but has a complex geometry, computing translational differentials using a correlation-filter based approach using the database-image and the scanned-image;

otherwise, if the database-image is not a line-and-space pattern and does not have a complex geometry, computing translational differentials using an orthogonal-projection based approach using the database-image and the scanned-image;

wherein accuracy of the computed translational differentials is significantly increased because the method chooses a technique for computing the translational differentials which is suitable for a type of pattern present in the database-image.

27. An apparatus for computing translational differentials between a database-image and a scanned-image of a photomask, the apparatus comprising:

a receiving-mechanism configured to receive the database-image that is noise free and the scanned-image that is generated by an imaging process;

a pattern-determining mechanism configured to determine whether the database-image is a line-and-space pattern;

a computing mechanism, wherein if the database-image is a line-and-space pattern, the computing mechanism is configured to,
convert the scanned-image into a polarity-enhanced-image; and
compute translational differentials by performing a correlation using the database-image and the polarity-enhanced-image;

otherwise, if the database-image is not a line-and-space pattern, the computing mechanism is configured to compute translational differentials by performing a correlation using the database-image and the scanned-image;

wherein accuracy of the computed translational differentials is significantly increased because the apparatus chooses a technique for computing the translational differentials which is suitable for a type of pattern present in the database-image.

28. The apparatus of claim 27, wherein the pattern-determining mechanism includes:

a vector-computing mechanism configured to compute database-projection-vectors using the database-image by taking orthogonal projections along a set of directions; and a second pattern-determining mechanism configured to determine whether only one of the computed database-projection-vectors contains a square-wave pattern, while other database-projection vectors contain a straight line.

29. The apparatus of claim 27, wherein the computing mechanism includes:

a direction-identifying mechanism configured to identify a projection-direction for which a corresponding database-projection-vector contains a square-wave pattern, wherein the corresponding database-projection-vector is computed using the database-image by taking an orthogonal projection along the projection-direction;

a vector-computing mechanism configured to compute a scanned-projection-vector using the scanned-image by taking an orthogonal projection along the projection-direction;

a peak-identifying mechanism configured to identify peaks in the computed scanned-projection-vector;

an interval-categorizing mechanism configured to categorized an inter-peak interval by comparing values at the edges of the inter-peak interval with an average value over the inter-peak interval; and a pixel-changing mechanism configured to change a value of a pixel in the scanned-image based on the category of a corresponding inter-peak interval, wherein a pixel corresponds to an inter-peak interval if, while taking an orthogonal projection along the projection-direction, the pixel contributes to an element in the inter-peak interval.

30. The apparatus of claim 27, wherein the computing mechanism includes:

a geometry-determining mechanism configured to determine whether the database-image has a complex geometry;

a second computing mechanism, wherein if the database-image has a complex geometry, the second computing mechanism is configured to compute translational differentials using a correlation-filter based approach;

otherwise, if the database image does not have a complex geometry, the second computing mechanism is configured to compute translational differentials using an orthogonal-projection based approach.

31. The apparatus of claim 30, wherein the geometry-determining mechanism includes:

a vector-computing mechanism configured to compute database-projection-vectors using the database-image by taking orthogonal projections along a set of directions;

a differentiating mechanism configured to differentiate the database-projection-vectors to obtain differentiated database-projection-vectors; and an element-counting mechanism configured to determine whether one or more of said differentiated database-projection-vectors contain many non-zero elements.

32. The apparatus of claim 30, wherein the second computing mechanism includes:

a tiling-mechanism configured to tile the scanned image and the database image to obtain a tiled scanned-image and a tiled database-image, respectively, wherein the tiled scanned-image contains a set of sub-images which are decimated versions of the scanned image and the tiled database-image contains a set of sub-images which are decimated versions of the database image;

an image-converting mechanism configured to convert the tiled scanned-image and the tiled database-image into a windowed scanned-image and a windowed database-image, respectively, by windowing each sub-image in the tiled scanned-image and the tiled database-image;

a transform-applying mechanism configured to apply a fast-Fourier-transform to the windowed scanned-image to obtain a transformed-image;

a filter-applying mechanism configured to apply a correlation-filter-template to the transformed image to obtain a filtered-image;

a transform-performing mechanism configured to perform an inverse-fast-Fourier-transform using the filtered-image and a fast-Fourier-transform of the windowed database-image to obtain a correlation-function;

a peak-identifying mechanism configured to identify a peak in the correlation-function; and a third computing mechanism configured to compute the translational differentials based on location of the identified peak.

33. The apparatus of claim 30, wherein the second computing mechanism includes:

a candidate-computing mechanism configured to compute a set of candidate-translational-differentials using the database-image and the scanned-image;

a gradient-image-generating mechanism configured to generate one or more sets of translated directional-gradient-images based on the set of candidate-translational-differentials and using the database-image and the scanned-image;

a image-converting mechanism configured to convert the database-image into a set of smoothed directional-gradient-images; and a differential-computing mechanism configured to compute the translational differentials by performing a normalized correlation using the set of smoothed directional-gradient-images and the one or more sets of translated directional-gradient-images;

wherein computational time is significantly reduced because the method performs normalized correlation using the set of candidate-translational-differentials, instead of exhaustively performing normalized correlation using all possible translational differentials.

34. The apparatus of claim 33, wherein the candidate-computing mechanism includes:

a second image-converting mechanism configured to convert the database-image and the scanned-image into a database-gradient-image and a scanned-gradient-image, respectively;

a vector-computing mechanism configured to compute database-projection-vectors from the database-gradient-image and scanned-projection-vectors from the scanned-gradient-image by taking orthogonal projections along a set of directions;

a vector-extracting mechanism configured to extract correlation-vectors from the computed database-projection-vectors;

a vector-mapping mechanism configured to map the scanned-projection-vectors to obtain accumulator-vectors in an accumulator space by using the correlation-vectors; and a second candidate-computing mechanism configured to compute a set of candidate-translational-differentials based on peak-cluster locations in the accumulator space, wherein a peak-cluster is a collection of contiguous elements around a peak (including the peak).

35. The apparatus of claim 34, wherein the second image-converting mechanism includes:

a filter-creating mechanism configured to create a directional-gradient filter using the database-image, wherein the directional-gradient filter can be used to attenuate edgels that do not conform to directional gradients of feature edges in the database-image;

a third image-converting mechanism configured to convert the database-image and the scanned-image into a set of database directional-gradient-images and a set of scanned directional-gradient-images, respectively;

an image-generating mechanism configured to generate a raw database-gradient-image and a raw scanned-gradient-image from the set of database directional-gradient-images and the set of scanned directional-gradient-images, respectively; and a filter-applying mechanism configured to apply the directional-gradient filter to the raw database-gradient-image and the raw scanned-gradient-image to obtain the database-gradient-image and the scanned-gradient-image, respectively.

36. The apparatus of claim 34, wherein the gradient-image-generating mechanism includes:

a de-projecting mechanism configured to de-project only cluster-peaks in the accumulator-vectors to obtain reconstructed scanned-projection-vectors;

a second de-projecting mechanism configured to de-project the reconstructed scanned-projection-vectors to obtain reconstructed directional-gradient-images; and an image-generating mechanism configured to generate one or more sets of translated directional-gradient-images by displacing the reconstructed directional-gradient-images using the set of candidate-translational-differentials;

wherein de-projecting only the cluster-peaks improves signal-to-noise ratio of the reconstructed directional-gradient-images.

37. The apparatus of claim 35, wherein the filter-creating mechanism includes:

an image-convolving mechanism configured to convolve the database-image with a horizontal and a vertical Point Spread Function (PSF) to generate a horizontal edgel-image and a vertical edgel-image, respectively;

an image-computing mechanism configured to compute a gradient-magnitude-image using the horizontal edgel-image and the vertical edgel-image;

a second filter-applying mechanism configured to apply a clip-low filter to the gradient-magnitude-image to obtain a clipped-gradient-image;

a histogram-generating mechanism configured to generate a histogram using gradient orientations in the clipped-gradient-image; and a second filter-creating mechanism configured to create the directional-gradient filter using the histogram.

38. The apparatus of claim 33, wherein the image-converting mechanism includes:

a fourth image-converting mechanism configured to convert the database-gradient-image into a set of unsmoothed directional-gradient-images; and a third filter-applying mechanism configured to apply a low-pass filter to the set of unsmoothed directional-gradient-images to obtain the set of smoothed directional-gradient-images.

39. An apparatus for computing translational differentials between a database-image and a scanned-image of a photomask, the apparatus comprising:
- an image-receiving mechanism configured to receive the database-image that is noise free and the scanned-image that is generated by an imaging process;
- a geometry-determining mechanism configured to determine whether the database-image has a complex geometry;
- a pattern-determining mechanism configured to determine whether the database-image is a line-and-space pattern;
- a differential-computing mechanism, wherein if the database-image is a line-and-space pattern, the differential-computing mechanism is configured to,
  - convert the scanned-image into a polarity-enhanced-image; and
  - compute translational differentials by performing a correlation using the database-image and the polarity-enhanced-image;
- otherwise, if the database-image is not a line-and-space pattern but has a complex geometry, the differential-computing mechanism is configured to compute translational differentials using a correlation-filter based approach using the database-image and the scanned-image;
- otherwise, if the database-image is not a line-and-space pattern and does not have a complex geometry, the differential-computing mechanism is configured to compute translational differentials using an orthogonal-projection based approach using the database-image and the scanned-image;
- wherein accuracy of the computed translational differentials is significantly increased because the method chooses a technique for computing the translational differentials which is suitable for a type of pattern present in the database-image.

* * * * *

UNITED STATES PATENT AND TRADEMARK OFFICE
CERTIFICATE OF CORRECTION

| | | |
|---|---|---|
| PATENT NO. | : 7,260,813 B2 | Page 1 of 1 |
| APPLICATION NO. | : 10/973890 | |
| DATED | : August 21, 2007 | |
| INVENTOR(S) | : Robert W. Du et al. | |

It is certified that error appears in the above-identified patent and that said Letters Patent is hereby corrected as shown below:

In claim 24 (at column 22, line 58), please delete the word, "the-" so that the phrase reads --generating a histogram using gradient orientations in ...--

Signed and Sealed this

Thirtieth Day of October, 2007

JON W. DUDAS
*Director of the United States Patent and Trademark Office*